United States Patent
Kikuchi et al.

(10) Patent No.: US 8,284,887 B2
(45) Date of Patent: Oct. 9, 2012

(54) CLOCK DATA RECOVERY CIRCUIT AND MULTIPLIED-FREQUENCY CLOCK GENERATION CIRCUIT

(75) Inventors: Hidekazu Kikuchi, Kanagawa (JP); Hideo Morohashi, Kanagawa (JP); Tomokazu Tanaka, Kanagawa (JP)

(73) Assignee: Sony Corporation, Tokyo (JP)

(*) Notice: Subject to any disclaimer, the term of this patent is extended or adjusted under 35 U.S.C. 154(b) by 423 days.

(21) Appl. No.: 12/656,833

(22) Filed: Feb. 17, 2010

(65) Prior Publication Data
US 2010/0264963 A1     Oct. 21, 2010

(30) Foreign Application Priority Data
Apr. 20, 2009  (JP) ................ 2009-101939

(51) Int. Cl.
*H03D 3/24*     (2006.01)
(52) U.S. Cl. ........ 375/376; 375/226; 375/276; 375/375; 375/327
(58) Field of Classification Search ............ 375/376, 375/157, 276, 375, 327, 266
See application file for complete search history.

(56) References Cited

U.S. PATENT DOCUMENTS

| | | | | |
|---|---|---|---|---|
| 5,512,860 A | * | 4/1996 | Huscroft et al. | 331/1 A |
| 5,917,352 A | * | 6/1999 | Dunlap et al. | 327/158 |
| 6,041,090 A | * | 3/2000 | Chen | 375/376 |
| 6,900,676 B1 | * | 5/2005 | Tamura | 327/156 |
| 7,089,444 B1 | * | 8/2006 | Asaduzzaman et al. | 713/600 |
| 7,336,754 B2 | * | 2/2008 | Aoyama | 375/376 |
| 8,036,300 B2 | * | 10/2011 | Evans et al. | 375/276 |
| 8,085,893 B2 | * | 12/2011 | Werner | 375/376 |
| 2007/0021933 A1 | * | 1/2007 | Sanduleanu et al. | 702/72 |
| 2007/0058768 A1 | * | 3/2007 | Werner | 375/376 |

FOREIGN PATENT DOCUMENTS
JP     3239543     10/2001

* cited by examiner

*Primary Examiner* — Kenneth Lam
(74) *Attorney, Agent, or Firm* — Rader Fishman & Grauer, PLLC

(57) ABSTRACT

Disclosed herein is a clock data recovery circuit including: a first phase detector; a loop filter; a charge pump; a voltage-controlled oscillator; a second phase detector; a phase correction information generation section; and a phase correction information addition section.

9 Claims, 14 Drawing Sheets

If Q1≠QE then DOWN
else If QE≠Q2 then UP (Interleaved retimed DATA)

US 8,284,887 B2

CLOCK DATA RECOVERY CIRCUIT AND MULTIPLIED-FREQUENCY CLOCK GENERATION CIRCUIT

BACKGROUND OF THE INVENTION

1. Field of the Invention

The present invention relates to a CDR (Clock Data Recovery) circuit provided with a hybrid-type PD (Phase Detector) implemented by a Hogge PD and an Alexander PD to serve as a circuit designed for an irregular NRZ signal and relates to a multiplied-frequency clock generation circuit adopting the same principle as the CDR circuit.

2. Description of the Related Art

FIG. 1 is a block diagram showing a CDR (Clock Data Recovery) circuit 10 provided with a Hogge PD (Phase Detector) to serve as a circuit designed for an irregular NRZ signal (refer to Hogge, CP: "A Self Correcting Clock Recovery Circuit," Journal of Lightwave Technology, LT $3^{rd}$ Volume, No. 6, December 1985, pp. 1312-1314).

As shown in the block diagram, the CDR circuit 10 employs a Hogge PD 11, a first CP (Charge Pump) 12, a second CP 13, an LP (Loop Filter) 14 and a VCO (Voltage-controlled Oscillator) 15.

The Hogge PD 11 has a first DFF (D Flip-Flop) 11a for latching input data IDT, which is irregular NRZ data, with a timing determined by an eye-center clock signal ECCK. The Hogge PD 11 also has a second DFF 11b for latching Q1, which serves as the output of the first DFF 11a, with a timing determined by an eye-edge clock signal ECCK having a phase opposite to that of the eye-center clock signal ECCK.

In addition, the Hogge PD 11 also has a first EXOR (exclusive logical OR circuit) 11c for detecting a state of logical mismatching between the input data IDT and the output Q1 which serves as the output of the second DFF 11. On top of that, the Hogge PD 11 also has a second EXOR 11d for detecting a state of logical mismatching between the output Q1 and a signal Q2 which serves as the output of the second DFF 12.

In addition, the Hogge PD 11 also has a buffer 11e for delaying a clock signal CLK generated by the VCO 15 and supplying the delayed clock signal to the first DFF 11a as the eye-center clock signal ECCK. On top of that, the Hogge PD 11 also has an inverter 11f for inverting the clock signal CLK generated by the VCO 15 and supplying the inverted clock signal to the second DFF 11b as the eye-edge clock signal EECK.

A signal output by the first EXOR 11c serves as an up signal UP for driving the first charge pump (CP+) 12 to electrically charge the LF 14 with a current which is also referred to hereafter as an electrical charging current. On the other hand, a signal output by the second EXOR 11d serves as a down signal DOWN for driving the second charge pump (CP-) 13 to electrically discharge a current from the LF 14. In the following description, the current discharged by the second charge pump (CP-) 13 from the LF 14 is referred to as an electrical discharging current.

The LF 14 is a component for integrating and smoothing the electrical charging current supplied to the LF 14 by the first charge pump (CP+) 12 and the electrical discharging current drawn from the LF 14 by the second charge pump (CP-) 13 in order to generate an input signal to be fed to the VCO 15.

The VCO 15 is a component for generating the aforementioned clock signal CLK with a frequency according to the voltage of the input signal received from the LF 14. The clock signal CLK generated by the VCO 15 serves as a recovered clock signal RCCK output by the CDR circuit 10. On the other hand, the output Q1 generated by the first DFF 11a serves as retimed data RTDT output by the Hogge PD 11.

FIG. 2 is a timing diagram showing timing charts of operations carried out by the Hogge PD 11.

As shown in the timing diagram, the up signal UP generated by the first EXOR 11c is sustained at a high level during a period between times t1 and t2. The time t1 is a time at which the level of the input data IDT is changed. As described above, the input data IDT is irregular NRZ data. The time t2 is a time at which the eye-center clock signal ECCK rises, causing the first DFF 11a to latch the input data IDT and change the level of the output Q1 generated by the first DFF 11a.

The period between the times t1 and t2 is the time delay of the eye-center clock signal ECCK relative to the change of the level of the input data IDT. That is to say, the period between the times t1 and t2 is an analog quantity representing the phase exhibited by the clock signal CLK output by the VCO 15 as a phase relative to the input data IDT.

The down signal DOWN generated by the second EXOR 11d is sustained at a high level during a period between the time t2 and a time t3. As described above, the time t2 is a time at which the level of the output Q1 is changed. The time t3 is a time at which the eye-edge clock signal EECK rises, causing the second DFF 11b to latch the output Q1 and change the level of the output Q2 generated by the second DFF 11b.

The period between the times t2 and t3 is the pulse width (t3−t2) of the down signal DOWN and typically equal to half the period of the clock signal CLK generated by the VCO 15.

After the CDR feedback loop of the CDR circuit 10 has been settled in a steady state, the period of the electrical charging process carried out to supply an electrical charging current from the first charge pump (CP+) 12 to the loop filter 14 in accordance with the up signal UP is balanced on the average with the period of the electrical discharging process carried out to draw an electrical discharging current from the loop filter 14 to the second charge pump (CP-) 13 in accordance with the down signal DOWN.

Thus, if the absolute value of the magnitude of the electrical charging current supplied from the first charge pump (CP+) 12 to the loop filter 14 is equal to the absolute value of the magnitude of the electrical discharging current supplied from the loop filter 14 to the second charge pump (CP-) 13, the phase of the clock signal CLK generated by the VCO 15 is locked at an angle which makes the width of the high pulse of the up signal UP equal to the width of the high pulse of the down signal DOWN.

As a result, the width of the pulse of the up signal UP is equal to the width of the pulse of the down signal DOWN and, therefore, equal to half the period of the clock signal CLK generated by the VCO 15. That is to say, the phase of the clock signal CLK generated by the VCO 15 is locked upon the lapse of time equal to half the period of the clock signal CLK generated by the VCO 15 since the change of the level of the input data IDT. In other words, the phase of the clock signal CLK generated by the VCO 15 is locked at the middle of the irregular NRZ data.

In an actually manufactured integrated circuit, however, it is difficult to make the absolute value of the magnitude of the electrical charging current supplied from the first charge pump (CP+) 12 to the loop filter 14 perfectly equal to the absolute value of the magnitude of the electrical discharging current supplied from the loop filter 14 to the second charge pump (CP-) 13.

Let the absolute value of the magnitude of the electrical discharging current supplied from the loop filter 14 to the second charge pump (CP-) 13 be Ip. If the integrated circuit has asymmetrical characteristic in which the absolute value of the magnitude of the electrical charging current supplied from the first charge pump (CP+) 12 to the loop filter 14 is [Ip+Δi], the following description holds true.

In order to make the period of the electrical charging process carried out to supply an electrical charging current from the first charge pump (CP+) 12 to the loop filter 14 in accordance with the up signal UP balanced on the average with the period of the electrical discharging process carried out to draw an electrical discharging current from the loop filter 14 to the second charge pump (CP−) 13 in accordance with the down signal DOWN, as shown in a diagram of FIG. 3, the pulse width of the up signal UP has to be made shorter than the pulse width of the down signal DOWN by −ΔT.

It is to be noted that reference notation Tc shown in the diagram of FIG. 3 denotes the period of the clock signal CLK generated by the VCO 15.

Based on the fact that the size of an area representing the electrical charge supplied to the loop filter 14 in the electrical charging process in the diagram of FIG. 3 is equal to the size of an area representing the electrical charge drawn from the loop filter 14 in the electrical discharging process in the same diagram, the value of ΔT can be computed as follows.

$$(Ip+\Delta i)(Tc/2-\Delta T) = IpTc/2 \quad (1)$$

$$\Delta T \sim Tc\Delta i/2Ip \quad (2)$$

$$\phi_E = 2\pi\Delta T/Tc \sim \pi\Delta i/Ip \quad (3)$$

FIG. 4 is a diagram showing a typical system configuration of a CDR feedback loop of the CDR circuit 10 which has the Hogge PD 11.

In the CDR feedback loop of the CDR circuit 10 having the Hogge PD 11, the eye-center clock signal ECCK has an equilibrium point at a position shifted from the center of each eye of the pattern composing the input data by ΔT which is approximated by Eq. (2).

In the CDR feedback loop shown in the system diagram of FIG. 4, the function of the Hogge PD 11 corresponds to subtraction to produce a steady-state phase error φE which is represented by Eq. (3).

In the system diagram of FIG. 4, reference notation Φ denotes the result of the Laplace transformation carried out on the phase φ of the input data IDT, reference notation Ω denotes the result of the Laplace transformation carried out on the angular frequency ω of the clock signal CLK generated by the VCO 15 and reference notation Θ denotes the result of the Laplace transformation carried out on the phase θ of the clock signal CLK.

In addition, reference notation Ip denotes the output current of the second charge pump (CP−) 13, reference notation N denotes the reciprocal of an average transition rate of the irregular NRZ data, symbol (R+1/sC) denotes the transfer function of the LF 14, which has a capacitor C and a resistor R connected in series to the capacitor C, whereas reference notation K denotes the sensitivity of the VCO 15. On top of that, reference notation φ E denotes a steady-state phase error caused by a difference in absolute magnitude between the electrical charging current supplied by the first charge pump (CP+) 12 to the LF 14 and the electrical discharging current drawn by the second charge pump (CP−) 13 from the LF 14.

The behavior of this loop system shows a quadratic response characteristic expressed by Eq. (4) which is given as follows.

$$\frac{\Theta + \phi E}{\Phi} = \frac{(s\tau+1)\omega_n}{s^2 + 2s\zeta\omega_n + \omega_n^2} \quad (4)$$

$$\tau = CR$$

$$\omega_n^2 = KIp/2\pi NC$$

$$\zeta = \tau\omega_n/2$$

In a steady state of the loop system shown in the diagram of FIG. 4 for φ=0, the angular frequency ω and the phase φ converge from their initial values to ω=0 and φ=−φE respectively without regard to the magnitudes of the initial values. These convergences of the angular frequency ω and the phase φ are shown as arrows along a locus on a phase-frequency plane in a diagram of FIG. 5.

On the assumption that the LF 14 and the VCO 15 are ideal and free of noises, in the CDR circuit 10 making use of the Hogge phase detector 11, the phase of the clock signal CLK generated by the VCO 15 does not fluctuate, being fixed at a point when the loop system is settled in a steady state. That is to say, when the loop system is settled in a steady state, no jitters are generated.

However, the convergence value of the phase φ is not 0, but −φE which is expressed by Eq. (3). As is obvious from Eq. (3), the convergence value of −φE is determined by a relative difference Δi/Ip between the electrical charging current supplied by the first charge pump (CP+) 12 to the LF 14 and the electrical discharging current drawn by the second charge pump (CP−) 13 from the LF 14. In addition, in a miniaturized integrated circuit, the relative difference Δi/Ip may exceed 0.2 in some cases. Thus, in such a case, the convergence value −φE becomes greater than 0.2π which is equal to 10% of the period of the clock signal CLK generated by the VCO 15.

The convergences in such a state much deteriorate the bearing force exhibited by the CDR circuit 10 as a force to receive a sudden phase change of the input data IDT in comparison with a case in which the phase □ converges to the ideal convergence value of 0. That is to say, the convergences in such a state much deteriorate the bearing force to receive input jitters.

FIG. 6 is a block diagram showing a CDR (Clock Data Recovery) circuit 10A which makes use of an Alexander PD (Phase Detector) 11A. For more information on this CDR circuit 10A, the reader is suggested to refer to Alexander, JDH: "Clock Recovery from Random Binary Signals," Electronic Letters, 11$^{th}$ Volume, No. 32, Oct. 30, 1975, pp. 541-542.

In comparison with the Hogge PD 11 employed in the configuration of the CDR circuit 10 shown in the block diagram of FIG. 1, the Alexander PD 11A is provided additionally with a third DFF (D Flip-Flop) 11g and a fourth DFF 11h.

In the Alexander PD 11A, the first EXOR 11c compares a value Q1 latched as a value of the input data IDT in the first DFF 11a with a timing determined by a specific eye-center clock signal ECCK to a value QE latched in the fourth DFF 11h with a timing determined by an eye-center clock signal ECCK immediately preceding the specific eye-center clock signal ECCK. The value QE latched in the fourth DFF 11h with a timing determined by the immediately preceding eye-center clock signal ECCK is a value that has been latched in the third DFF 11g with a timing determined by an eye-center clock signal ECCK appearing at a position in close proximity to an eye edge. If the comparison result produced by the first EXOR 11c indicates that the value Q1 latched with a timing determined by the specific eye-center clock signal ECCK does not match the value QE latched with a timing determined by the immediately preceding eye-center clock signal ECCK, the eye-edge clock signal EECK is determined to arrive before the eye edge. Thus, in this case, the first EXOR 11c employed in the Alexander PD 11A outputs the down signal DOWN in order to shift backward the too advanced phase of the clock signal CLK generated by the VCO 15.

On the other hand, the second EXOR 11d compares a value Q2 latched as a value of the input data IDT in the second DFF 11b with a timing determined by a particular eye-center clock signal ECCK to a value QE latched in the fourth DFF 11h with a timing determined by an eye-center clock signal ECCK immediately succeeding the particular eye-center clock signal ECCK. The value QE latched in the fourth DFF 11h with a timing determined by the immediately succeeding eye-center clock signal ECCK is a value that has been latched in the third DFF 11g with a timing determined by an eye-center clock signal ECCK appearing at a position in close proximity to an eye edge. If a comparison result produced by the second EXOR 11d indicates that the value Q2 latched with a timing determined by the particular eye-center clock signal ECCK does not match the value QE latched with a timing determined by the immediately succeeding eye-center clock signal ECCK, the eye-edge clock signal EECK is determined to arrive after the eye edge. Thus, in this case, the second EXOR 11d employed in the Alexander PD 11A outputs the up signal UP in order to shift forward the too retarded phase of the clock signal CLK generated by the VCO 15.

The up signal UP and the down signal DOWN are fed back to the VCO 15 by way of the first charge pump (CP+) 12 and the second charge pump (CP−) 13 respectively so that the phase of the eye-edge clock signal EECK is locked at a position in close proximity to the level-change point (or the eye edge) of the input data IDT whereas the phase of the eye-center clock signal ECCK is locked at a position in close proximity to the center of each eye of the pattern composing the input data IDT.

FIG. 7 is a timing diagram showing timing charts of operations carried out by the Alexander PD 11A.

The Alexander PD 11A is different from the Hogge PD 11 in that the Alexander PD 11A is not capable of outputting an analog quantity representing how much the phase of the clock signal CLK output by the VCO 15 lags behind or leads ahead of the input data IDT.

The Alexander PD 11A is characterized in that, even if there is a difference between the absolute value of the magnitude of the electrical charging current supplied from the first charge pump (CP+) 12 driven by the up signal UP to the loop filter 14 and the absolute value of the magnitude of the electrical discharging current supplied from the loop filter 14 to the second charge pump (CP−) 13 driven by the down signal DOWN, an angle at which the phase of the clock signal CLK output by the VCO 15 is to be locked hardly changes.

FIG. 8 is a diagram showing a typical system configuration of a CDR feedback loop of the CDR circuit 10A which has the Alexander PD 11A.

That is to say, the loop system making use of the Alexander PD 11A is expressed by a model which is shown in the diagram of FIG. 8. As shown in the figure, the Alexander PD 11A in the CDR feedback loop is represented by the three elements on the left side, i.e., a difference computing element, a quantization element and a delay element.

By the way, the CDR circuit 10A including the Alexander PD 11A is desired to employ a capacitor C which has a large capacitance. The capacitor C is used as a component for reducing the phase amplitude of a limit cycle vibration. That is to say, the capacitor C serves as a component for reducing jitters.

The capacitor C having a large capacitance is a hindrance to integration of the circuit employing the capacitor C. In addition, the capacitor C undesirably decreases the width of the response band of the clock signal CLK generated by the VCO 15 for changes of the phase of the input data IDT.

The decreased width of the response band of the clock signal CLK generated by the VCO 15 for changes of the phase of the input data IDT deteriorates the bearing force which is exhibited by the CDR circuit 10A as a force to deal with jitters. This is because the decreased width of the response band of the clock signal CLK generated by the VCO 15 means that the CDR circuit 10A is incapable of sufficiently coping with high-frequency components in the fluctuation of the phase of the input data IDT.

By the way, this invention specification refers to Japanese Patent No. 3,239,543.

SUMMARY OF THE INVENTION

Operations carried out by the Hogge PD 11 and the Alexander PD 11A as described above can be summarized as follows. In the Hogge PD 11, the phase of the clock signal CLK generated by the VCO 15 should be locked at the center of each eye of the pattern composing the input data IDT. Due to the unbalance between the electrical charging current supplied to the LF 14 by the first charge pump (CP+) 12 and the electrical discharging current drawn from the LF 14 by the second charge pump (CP−) 13, however, the phase of the clock signal CLK generated by the VCO 15 is locked at a position which is shifted from the center of each eye of the pattern composing the input data IDT. Thus, the Hogge PD 11 has a demerit that the reception margin of the CDR circuit 10 is reduced in the event of a sudden change of the phase of the input data IDT.

In the case of the Alexander PD 11A, on the other hand, a restriction has to be imposed on the time constant of the LF 14 in order to reduce periodical jitters which are caused by limit cycles. The restriction imposed on the time constant of the LF 14 has an impact on the surface occupied by an integrated circuit in which the CDR circuit 10 is to be embedded. Thus, it is no longer possible to set the width of the band of the phase response to the input data IDT at a large value.

As a result, the Alexander PD 11A has a demerit that the probability of erroneous reception by the CDR circuit 10A increases due to the incapability of sufficiently coping with most high-frequency components of the input data IDT.

In order to solve the problems described above, inventors of the present invention have innovated a CDR (Clock Data Recovery) circuit and a multiplied-frequency clock generation circuit, which are capable of preventing the reception margin for a sudden change of the phase of input data from decreasing and preventing the probability of erroneous reception from increasing.

A clock data recovery circuit according to a first mode of the present invention employs: a first phase detector configured to detect a difference in phase between input data and a clock signal extracted from the input data and generate signals each representing an analog quantity corresponding to the difference in phase; a loop filter configured to indirectly integrate and smooth the signals output by the first phase detector; a charge pump configured to supply an electrical charging current to the loop filter in accordance with a specific one of the signals output by the first phase detector or draw an electrical discharging current from the loop filter in accordance with another one of the signals output by the first phase detector; a voltage-controlled oscillator configured to generate the extracted clock signal vibrating at a frequency determined by a voltage output by the loop filter; a second phase detector configured to detect the polarity of the difference in phase between the input data and the extracted clock signal; a phase correction information generation section configured to generate phase correction information to be used for eliminating a phase offset of the first phase detector in accordance with detection results produced by the second phase detector; and a phase correction information addition section configured to add the phase correction information generated by the phase correction information generation section to a feedback loop including the first phase detector, the loop filter, the charge pump and the voltage-controlled oscillator.

The phase correction information addition section increases or decreases the electrical charging current supplied from the charge pump to the loop filter and decreases or increases the electrical discharging current drawn from the loop filter to the charge pump.

A multiplied-frequency clock generation circuit according to a second mode of the present invention employs: a first phase detector configured to detect a difference in phase between input clock and a multiplied-frequency clock signal and generate signals each representing an analog quantity corresponding to the difference in phase; a loop filter configured to indirectly integrate and smooth the signals output by the first phase detector; a charge pump configured to supply an electrical charging current to the loop filter in accordance with a specific one of the signals output by the first phase detector or draw an electrical discharging current from the loop filter in accordance with another one of the signals output by the first phase detector; a voltage-controlled oscillator configured to generate the multiplied-frequency clock signal vibrating at a frequency determined by a voltage output by the loop filter; a frequency divider configured to divide the frequency of the multiplied-frequency clock signal generated by the voltage-controlled oscillator in order to result in a divided frequency and output a divided-frequency clock signal having the divided frequency to the first phase detector; a second phase detector configured to detect the polarity of the difference in phase between the input clock and the multiplied-frequency clock signal; a phase correction information generation section configured to generate phase correction information to be used for eliminating a phase offset of the first phase detector and the frequency divider in accordance with a detection result produced by the second phase detector; and a phase correction information addition section configured to add the phase correction information generated by the phase correction information generation section to a feedback loop including the first phase detector, the loop filter, the charge pump, and the voltage-controlled oscillator.

The phase correction information addition section increases or decreases the electrical charging current supplied from the charge pump to the loop filter and decreases or increases the electrical discharging current drawn from the loop filter to the charge pump.

In accordance with the embodiments of the present invention, it is possible to prevent the reception margin for a sudden change of the phase of input data from decreasing and prevent the probability of erroneous reception from increasing.

DETAILED DESCRIPTION OF THE PREFERRED EMBODIMENTS

Preferred embodiments of the present invention are explained below by referring to the diagrams briefly explained above. It is to be noted that the embodiments are explained in chapters which are arranged as follows.

1: First Embodiment Implementing a First Typical Configuration of the CDR Circuit
2: Second Embodiment Implementing a Second Typical Configuration of the CDR Circuit
3: Third Embodiment Implementing a Third Typical Configuration of the CDR Circuit
4: Fourth Embodiment Implementing a Typical Configuration of a CMU 1: First Embodiment Implementing a First Typical Configuration of the CDR Circuit FIG. 9 is a block diagram showing the configuration of a CDR circuit 100 according to a first embodiment of the present invention.

Figure 9:
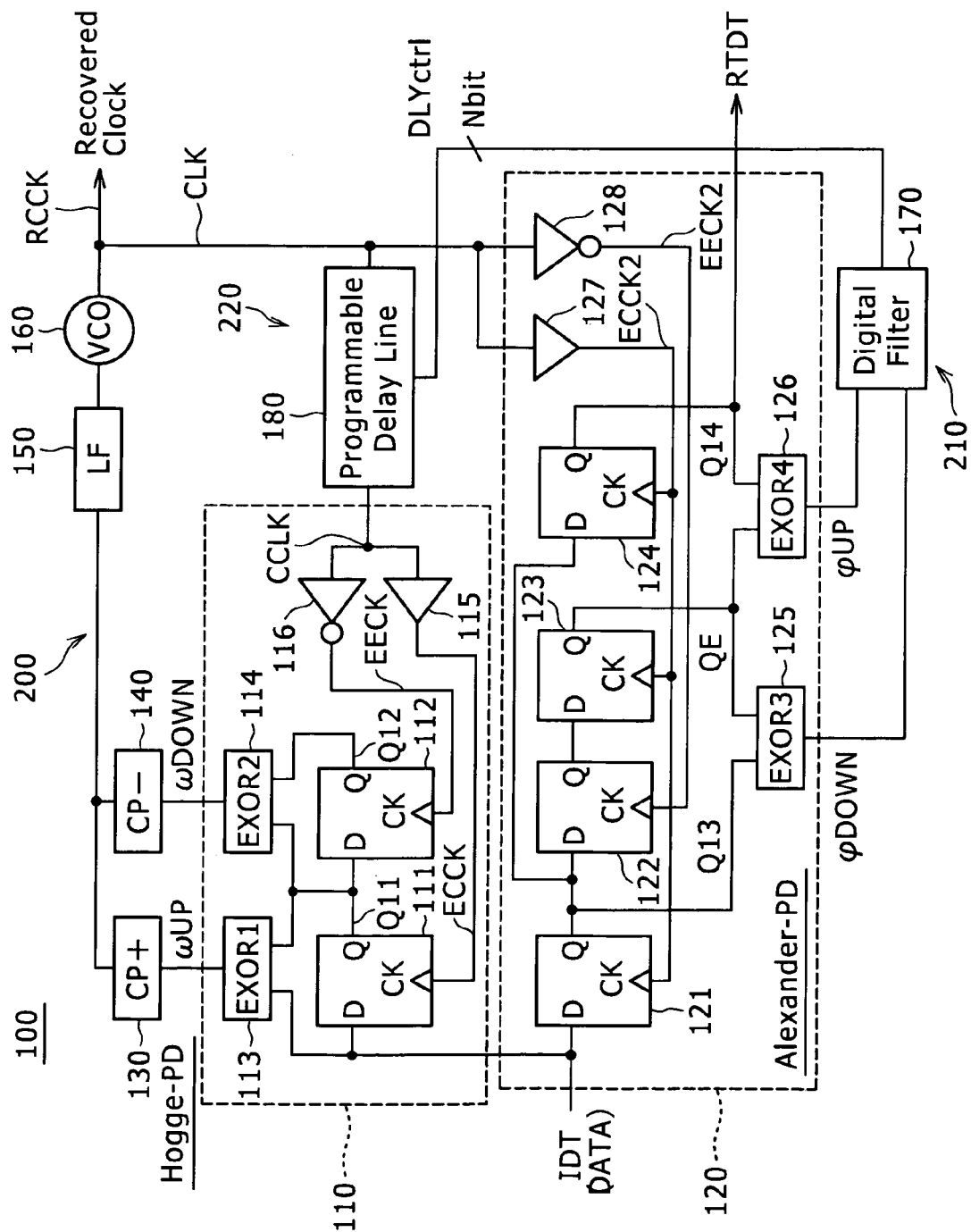
FIG. 9 is a block diagram showing the configuration of a CDR circuit according to a first embodiment of the present invention.

As shown in the block diagram of FIG. 9, the CDR circuit 100 according to the first embodiment employs a first phase detector 110, a second phase detector 120, a first charge pump (CP+) 130, a second charge pump (CP−) 140, an LF (Loop Filter) 150 and a VCO (Voltage-Controlled Oscillator) 160.

In addition, the CDR circuit 100 also has a digital filter 170 and a programmable delay line 180.

The first phase detector 110 is a Hogge phase detector whereas the second phase detector 120 is an Alexander phase detector. Thus, the CDR circuit 100 according to the first embodiment has a hybrid phase detector which is implemented by the first phase detector 110 and the second phase detector 120.

Basically, the CDR circuit 100 according to the first embodiment is provided with a function to extract a clock signal CLK from input data IDT which is irregular NRZ data.

The first phase detector 110 has a function to detect a difference in phase between the input data IDT and the clock signal CLK extracted from the input data IDT and generate signals each representing an analog quantity corresponding to the difference in phase. The first phase detector 110 supplies the signals to the loop filter 150 by way of the first charge pump (CP+) 130 and the second charge pump (CP−) 140 respectively. The loop filter 150 is a section for indirectly integrating and smoothing the signals generated by the first phase detector 110.

The first phase detector 110, the first charge pump (CP+) 130 (or the second charge pump (CP−) 140), the loop filter 150 and the VCO 160 form a CDR feedback loop 200. The VCO 160 is a section for generating the clock signal CLK which is vibrating at a frequency according to a voltage received from the loop filter 150.

The second phase detector 120 has a function to detect the polarity of a difference in phase between the input data IDT and the clock signal CLK.

In addition, the CDR circuit 100 also has a phase correction information generation section 210 and a phase correction information addition section 220. The phase correction information generation section 210 is a section for generating phase correction information to be used for eliminating a phase offset of the first phase detector in accordance with detection results produced by the second phase detector 120. On the other hand, the phase correction information addition section 220 is a section for adding the phase correction information generated by the phase correction information generation section 210 to the CDR feedback loop 200.

In the first embodiment, a digital filter 170 and a programmable delay line 180 function as the phase correction information generation section 210 and the phase correction information addition section 220 respectively.

In the CDR circuit 100 according to the first embodiment, the programmable delay line 180 is inserted into a location between the VCO 160 and a clock input section of the first phase detector 110 in the CDR feedback loop 200 which also includes the first charge pump (CP+) 130, the second charge pump (CP−) 140 and the LF 150. That is to say, the CDR feedback loop 200 has the first charge pump (CP+) 130, the second charge pump (CP−) 140, the LF 150, the VCO 160, the programmable delay line 180 and the first phase detector 110.

The programmable delay line 180 is controlled by an N-bit output signal DLYctrl generated by the digital filter 170 to serve as a delay control signal for controlling a time delay imposed by the programmable delay line 180. These functions will be described in detail later. The N bits of the output signal DLYctrl are referred to as C0 to Cn−1 respectively.

The first phase detector 110 employs a first DFF (D Flip-Flop) 111, a second DFF 112, a first EXOR (exclusive OR circuit) 113, a second EXOR 114, a buffer 115 and an inverter 116. The first DFF 111 and the second DFF 112 function as first and second data latches respectively. On the other hand, the first EXOR 113 serves as a first mismatching-state detection circuit whereas the second EXOR 114 serves as a second mismatching-state detection circuit.

The D input terminal of the first DFF 111 is connected to a line for supplying the input data IDT which is irregular NRZ data as described above. The Q output terminal of the first DFF 111 is connected to the D input terminal of the second DFF 112. The Q output terminal of the first DFF 111 is also connected to a specific one of the two input terminals of the first EXOR 113 and a specific one of the two input terminals of the second EXOR 114.

The CK clock terminal of the first DFF 111 is connected to the output terminal of the buffer 115 by a line for supplying an eye-center clock signal ECCK from the buffer 115 to the first DFF 111.

The Q output terminal of the second DFF 112 is connected to the other input terminal of the second EXOR 114. The CK clock terminal of the second DFF 112 is connected to the output terminal of the inverter 116 by a line for supplying an eye-edge clock signal EECK from the inverter 116 to the second DFF 112.

The other input terminal of the first EXOR 113 is connected to the line for supplying the input data IDT.

The first DFF 111 latches the irregular NRZ data serving as the input data IDT with a timing determined by the eye-center clock signal ECCK.

The second DFF 112 latches the output Q11 of the first DFF 111 with a timing determined by the eye-edge clock signal EECK which has a phase opposite to the phase of the eye-center clock signal ECCK.

The first EXOR 113 detects a state of logical mismatching between the input data IDT and the output Q11 of the first DFF 111. When the first EXOR 113 detects a state of logical mismatching between the input data IDT and the output Q11, the first EXOR 113 outputs an up signal ωUP to the first charge pump (CP+) 130.

On the other hand, the second EXOR 114 detects a state of logical mismatching between the output Q11 of the first DFF 111 and the output Q12 of the second DFF 112. When the second EXOR 114 detects a state of logical mismatching between the output Q11 and the output Q12, the second EXOR 114 outputs a down signal ωDOWN to the second charge pump (CP−) 140.

The up signal ωUP output by the first EXOR 113 drives the first charge pump (CP+) 130 to supply an electrical charging current to the loop filter 150. On the other hand, the down signal ωDOWN output by the second EXOR 114 drives the second charge pump (CP−) 140 to draw an electrical discharging current from the loop filter 150. The LF 150 indirectly integrates and smoothes the up signal ωUP and the down signal ωDOWN. In actuality, the LF 150 integrates and smoothes the electrical charging current supplied from the first charge pump (CP+) 130 to the LF 150 and the electrical discharging current drawn from the LF 150 to the second charge pump (CP−) 140, generating a voltage. The LF 150 outputs the generated voltage to the VCO 160 as an input signal of the VCO 160.

The VCO 160 generates the clock signal CLK which is vibrating at a frequency according to the input signal received from the loop filter 150. The clock signal CLK generated by the VCO 160 is referred to as an RCCK (Recovered Clock) signal output by the CDR circuit 100.

The second phase detector 120 employs a third DFF 121 serving as a third data latch, a fourth DFF 122 serving as a fourth data latch, a fifth DFF 123 serving as a fifth data latch and a sixth DFF 124 serving as a sixth data latch.

In addition, the second phase detector 120 also has a third EXOR 125, a fourth EXOR 126, a buffer 127 and an inverter 128. The third EXOR 125 serves as a third mismatching-state detection circuit whereas the fourth EXOR 126 serves as a fourth mismatching-state detection circuit.

The D input terminal of the third DFF 121 is connected to the line for supplying the input data IDT which is irregular NRZ data as described above. The Q output terminal of the third DFF 121 is connected to the D input terminal of the fourth DFF 122 and the D input terminal of the sixth DFF 124. The Q output terminal of the third DFF 121 is also connected to a specific one of the two input terminals of the third EXOR 125.

The CK clock terminal of the third DFF 121 is connected to the output terminal of the buffer 127 by a line for supplying another eye-center clock signal ECCK2 from the buffer 127 to the third DFF 121, the fifth DFF 123 and the sixth DFF 124.

The Q output terminal of the fourth DFF 122 is connected to the D input terminal of the fifth DFF 123.

The CK clock terminal of the fourth DFF 122 is connected to the output terminal of the inverter 128 by a line for supplying another eye-edge clock signal EECK2 from the inverter 128 to the fourth DFF 122.

The Q output terminal of the fifth DFF 123 is connected to a specific one of the two input terminals of the third EXOR 125 and a specific one of the two input terminals of the fourth EXOR 126.

The CK clock terminal of the fifth DFF 123 is connected to the output terminal of the buffer 127 by the line for supplying the other eye-center clock signal ECCK2 from the buffer 127 to the third DFF 121, the fifth DFF 123 and the sixth DFF 124.

The Q output terminal of the sixth DFF 124 is connected to the other input terminal of the fourth EXOR 126.

The CK clock terminal of the sixth DFF 124 is connected to the output terminal of the buffer 127 by the line for supplying the other eye-center clock signal ECCK2 from the buffer 127 to the third DFF 121, the fifth DFF 123 and the sixth DFF 124.

The third DFF 121 latches the irregular NRZ data serving as the input data IDT with a timing determined by the other eye-center clock signal ECCK2.

The fourth DFF 122 latches the output Q13 of the third DFF 121 with a timing determined by the other eye-edge clock signal EECK2 which has a phase opposite to the phase of the other eye-center clock signal ECCK2.

The fifth DFF 123 latches the output of the fourth DFF 122 with a timing determined by the other eye-center clock signal ECCK2 and supplies an output QE appearing at the Q output terminal of the fifth DFF 123 to the third EXOR 125 and the fourth EXOR 126.

The sixth DFF 124 latches the output Q13 of the third DFF 121 with a timing determined by the other eye-center clock signal ECCK2 and supplies an output Q14 appearing at the Q output terminal of the sixth DFF 124 to the fourth EXOR 126.

The third EXOR 125 detects a state of logical mismatching between the output Q11 of the first DFF 11 and the input data IDT. When the third EXOR 125 detects a state of logical mismatching between the output Q11 and the input data IDT, the third EXOR 125 outputs a down signal φDOWN to the digital filter 170.

On the other hand, the fourth EXOR 126 detects a state of logical mismatching between the output Q14 of the sixth DFF 124 and the output QE of the fifth DFF 123. When the fourth EXOR 126 detects a state of logical mismatching between the output Q14 and the output QE, the fourth EXOR 126 outputs an up signal φUP to the digital filter 170.

It is to be noted that the output Q14 appearing at the Q output terminal of the sixth DFF 124 serves as retimed data RTDT output by the second phase detector 120.

As described above, in the second phase detector 120, the third EXOR 125 compares an output Q13 latched as a value of the input data IDT in the third DFF 121 with a timing determined by a specific eye-center clock signal ECCK2 to a value QE latched in the fifth DFF 123 with a timing determined by an immediately preceding eye-center clock signal ECCK2 immediately preceding the specific eye-center clock signal ECCK2. The value QE latched in the fifth DFF 123 with a timing determined by the immediately preceding eye-center clock signal ECCK2 is a value which has been latched in the fourth DFF 122 with a timing determined by an eye-edge clock signal EECK2 appearing at a position in close proximity to an eye edge. If the comparison result produced by the third EXOR 125 indicates that the output Q13 latched with a timing determined by the specific eye-center clock signal ECCK2 does not match the value QE latched with a timing determined by the immediately preceding eye-center clock signal ECCK2, the eye-edge clock signal EECK2 is determined to arrive before the eye edge. Thus, in this case, the third EXOR 125 employed in the second phase detector 120 outputs the down signal φDOWN to the digital filter 170 in order to shift backward the too advanced phase of the clock signal CLK generated by the VCO 15.

On the other hand, the fourth EXOR 126 compares an output Q14 latched as a value of the input data IDT in the sixth DFF 124 with a timing determined by a particular eye-center clock signal ECCK2 to a value QE latched in the fifth DFF 123 with a timing determined by an immediately succeeding eye-center clock signal ECCK2 immediately succeeding the particular eye-center clock signal ECCK2. The value QE latched in the fifth DFF 123 with a timing determined by the immediately succeeding eye-center clock signal ECCK2 is a value which has been latched in the fourth DFF 122 with a timing determined by an eye-edge clock signal EECK2 appearing at a position in close proximity to an eye edge. If the comparison result produced by the fourth EXOR 126 indicates that the output Q14 latched with a timing determined by the particular eye-center clock signal ECCK2 does not match the value QE latched with a timing determined by the immediately succeeding eye-center clock signal ECCK2, the eye-edge clock signal EECK2 is determined to arrive after the eye edge. Thus, in this case, the fourth EXOR 126 employed in the second phase detector 120 outputs the up signal φUP to the digital filter 170 in order to shift forward the too retarded phase of the clock signal CLK generated by the VCO 15.

The following description explains the configuration of the digital filter 170 employed in the first embodiment to serve as the phase correction information generation section 210, functions carried out by the digital filter 170, the configuration of the programmable delay line 180 employed in the same embodiment to serve as the phase correction information addition section 220 and functions carried out by the programmable delay line 180.

First of all, the configuration of the programmable delay line 180 is explained.

Figure 10:
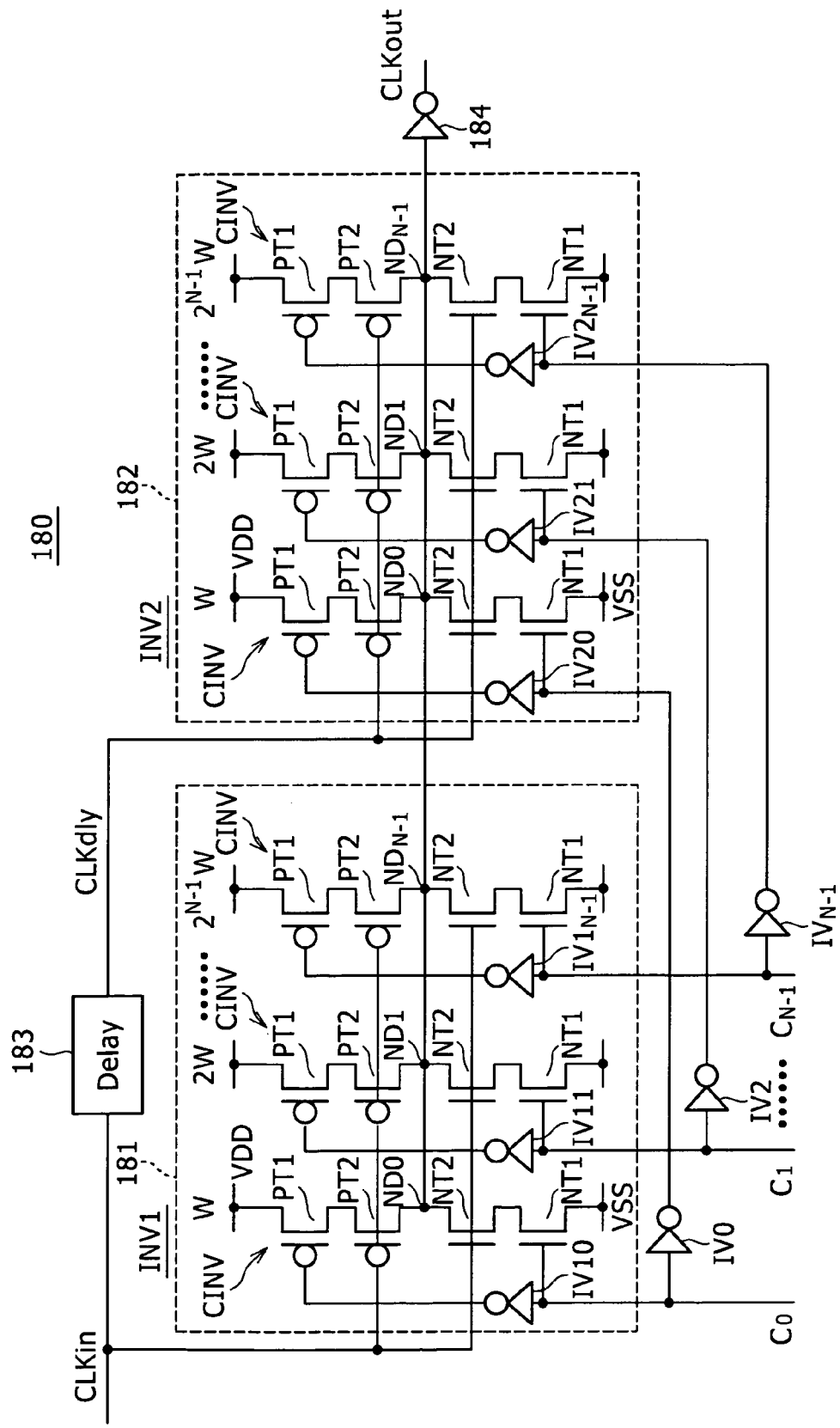
FIG. 10 is a circuit diagram showing a typical configuration of a programmable delay circuit employed in the CDR circuit to serve as a delay circuit according to the first embodiment.

FIG. 10 is a circuit diagram showing a typical configuration of the programmable delay circuit 180 according to the first embodiment.

The programmable delay line 180 shown in the circuit diagram of FIG. 10 employs a first inverter circuit 181 (INV1), a second inverter circuit 182 (INV2), a delay section 183, an inverter 184 and inverters IV0 to IVn−1.

The first inverter circuit 181 is a section for receiving the clock signal CLK generated by the VCO 160 and bits C0 to Cn−1 of the N-bit output signal DLYctrl generated by the digital filter 170 to serve as a delay control signal for controlling a time delay imposed by the programmable delay line 180 on the clock signal CLK.

The second inverter circuit 182 is a section for receiving a signal output by the delay section 183 and signals output by the inverters IV0 to IVn−1. The signal output by the delay section 183 is a signal which is obtained by delaying the clock signal CLK generated by the VCO 160 by delay time, the length of which is determined in advance. On the other hand, the signals output by the inverters IV0 to IVn−1 are signals which are obtained by inverting the bits C0 to Cn−1 of the N-bit output signal DLYctrl generated by the digital filter 170 to serve as a delay control signal for controlling a time delay imposed by the programmable delay line 180 on the clock signal CLK.

Each of the first inverter circuit 181 and the second inverter circuit 182 is provided with N clocked inverters CINV which share a common output terminal.

Each of the N clocked inverters CINV is configured to employ PMOS (P-channel MOS) transistors PT1 and PT2 as well as NMOS (N-channel MOS) transistors NT1 and NT2. The PMOS transistor PT1, the PMOS transistor PT2, the NMOS transistor NT1 and the NMOS transistor NT2 are connected in series between a power supply VDD and a reference electric potential VSS.

The drain of the PMOS transistor PT2 in each of the N clocked inverters CINV is connected to the drain of the NMOS transistor NT2 in the same N clocked inverter CINV to form a connection node ND. The connection nodes ND0 to NDn−1 of the N clocked inverters CINV are wired to each other to form the common output terminal mentioned above.

The first inverter circuit 181 carries out the following operations. The first inverter circuit 181 also has inverters INV10 to INV1n−1 which are provided for the N clocked inverters CINV respectively. As described above, reference numeral CLKin shown in the circuit diagram of FIG. 10 denotes the clock signal CLK received from the VCO 160. The input clock signal CLKin is supplied to the gates of the PMOS transistor PT2 and the NMOS transistor NT2 which are employed in each of the N clocked inverters CINV.

The bits C0 to Cn−1 of the N-bit output signal DLYctrl generated by the digital filter 170 to serve as a delay control signal for controlling a time delay imposed by the programmable delay line 180 are supplied respectively to the gates of the NMOS transistors NT1 employed in the N clocked inverters CINV which are provided at N stages respectively.

On the other hand, signals output by the inverters INV10 to INV1n−1 to represent the inverted values of the bits C0 to Cn−1 of the N-bit output signal DLYctrl serving as a delay control signal for controlling a time delay imposed by the programmable delay line 180 are supplied respectively to the gates of the PMOS transistors PT1 which are employed in the N clocked inverters CINV respectively.

By the same token, the second inverter circuit 182 carries out the following operations. The second inverter circuit 182 also has inverters IV20 to IV2n−1 which are provided for the N clocked inverters CINV respectively. Reference numeral CLKdly shown in the circuit diagram of FIG. 10 denotes a signal output by the delay section 183 by delaying the input clock signal CLKin received from the VCO 160 by delay time, the length of which is determined in advance. The delayed clock signal CLKdly is supplied to the gates of the PMOS transistor PT2 and the NMOS transistor NT2 which are employed in each of the N clocked inverters CINV included in the second inverter circuit 182.

The bits C0 to Cn−1 of the N-bit output signal DLYctrl generated by the digital filter 170 to serve as a delay control signal for controlling a time delay imposed by the programmable delay line 180 are inverted by the inverters IV0 to IVn−1 respectively. Signals output by the inverters IV0 to IVn−1 are supplied respectively to the gates of the NMOS transistors NT1 employed in the N clocked inverters CINV which are provided at N stages respectively.

On the other hand, signals output by the inverters IV20 to IV2n−1 to represent the inverted values of the signals output by the inverters IV0 to IVn−1 respectively are supplied respectively to the gates of the PMOS transistors PT1 which are employed in the N clocked inverters CINV respectively. As described above, the signals output by the inverters IV0 to IVn−1 respectively represent the inverted values of the bits C0 to Cn−1 of the N-bit output signal DLYctrl generated by the digital filter 170 to serve as a delay control signal for controlling a time delay imposed by the programmable delay line 180.

As explained so far, in the programmable delay line 180, the first inverter circuit 181 receives the input clock signal CLKin also supplied to the delay section 183 whereas the second inverter circuit 182 receives the delayed clock signal CLKdly which is a signal generated by the delay section 183 by delaying the input clock signal CLKin by delay time with the length thereof determined in advance.

The common output terminal shared by the N clocked inverters CINV employed in the first inverter circuit 181 and the common output terminal shared by the N clocked inverters CINV employed in the second inverter circuit 182 are an output terminal common to the first inverter circuit 181 and the second inverter circuit 182.

The first inverter circuit 181 and the second inverter circuit 182 complementarily change their effective gate widths by making use of the N delay control bits C0 to Cn−1 of the N-bit output signal DLYctrl generated by the digital filter 170 to serve as a delay control signal for controlling a time delay imposed by the programmable delay line 180.

At the output terminal common to the first inverter circuit 181 and the second inverter circuit 182, an output clock signal CLKout representing an analog sum of signals output by the first inverter circuit 181 and the second inverter circuit 182 appears. The analog sum is obtained by adding a weighted value of the signal output by the first inverter circuit 181 to a weighted value of the signal output by the second inverter circuit 182. The weights are determined in accordance with a gate-width ratio which is defined as a ratio of the gate width of the first inverter circuit 181 to the gate width of the second inverter circuit 182. The output clock signal CLKout is in essence a signal obtained by delaying the input clock signal CLKin generated by the VCO 160 by delay time having a length which changes in accordance with variations of a delay control signal determined by the N delay control bits C0 to Cn−1 of the N-bit output signal DLYctrl generated by the digital filter 170 to serve as a delay control signal for controlling a time delay imposed by the programmable delay line 180. That is to say, the N-bit output signal DLYctrl serves as a delay control signal for controlling the quantity of a delay imposed by the programmable delay line 180 on the phase of the input clock signal CLKin which is the clock signal CLK generated by the VCO 160.

The following description explains the configuration of the digital filter 170 and functions carried out by the digital filter 170.

Figures 11A, 11B:
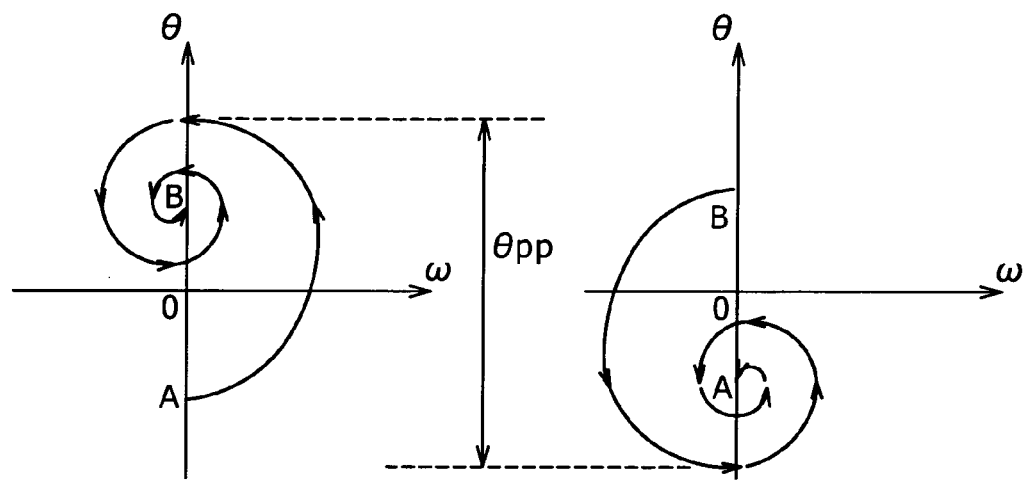
FIGS. 11A and 11B are diagrams showing a locus drawn on a phase-frequency plane as a locus of the CDR feedback loop of the CDR circuit according to the first embodiment.

FIGS. 11A and 11B are diagrams each showing a locus drawn on a phase-frequency plane as a locus of the CDR feedback loop of the CDR circuit 10A according to the first embodiment.

The digital filter 170 is a section for receiving the up signal φUP as well as the down signal φDOWN from the second phase detector 120 and outputting the N-bit output signal DLYctrl serving as a delay control signal to the programmable delay line 180. As described above, the second phase detector 120 is a section for comparing the phase of the input data IDT with the phase of the clock signal CLK generated by the VCO 160 and outputting the up signal φUP as well as the down signal φDOWN as a result of the comparison to the digital filter 170.

As explained before, due to the unbalance between the electrical charging current supplied from the first charge pump (CP+) 130 to the LF 150 and the electrical discharging current drawn from the LF 150 to the second charge pump (CP−) 140, the first phase detector 110 locks the phase of the output clock signal CLKout generated by the programmable delay line 180 at a position which is a position shifted from the center of each eye of the pattern composing the input data IDT.

In the first embodiment, on the basis of the detection result produced by the second phase detector 120, the digital filter 170 outputs the N-bit output signal DLYctrl serving as a delay control signal to the programmable delay line 180 in order to adjust the quantity of the delay generated by the programmable delay line 180. As a result, the phase of the clock signal CLK generated by the VCO 160 approaches the center of each eye of the pattern composing the input data IDT.

Figure 1:
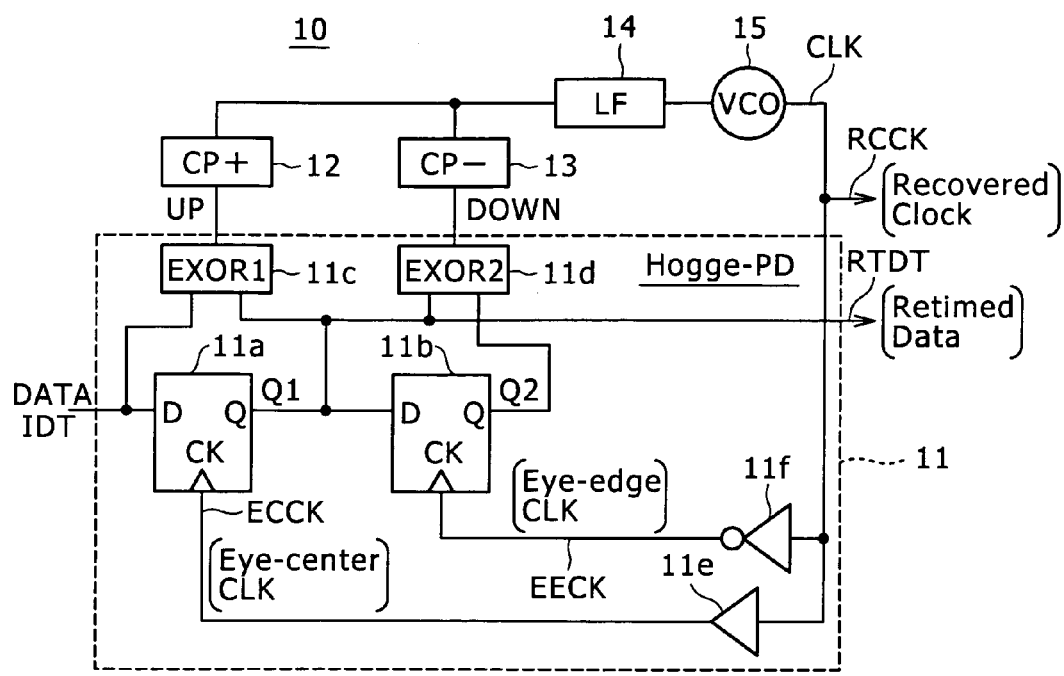
FIG. 1 is a block diagram showing a CDR (Clock Data Recovery) circuit provided with a Hogge PD (Phase Detector) to serve as a circuit for an irregular NRZ signal.
Figure 2:
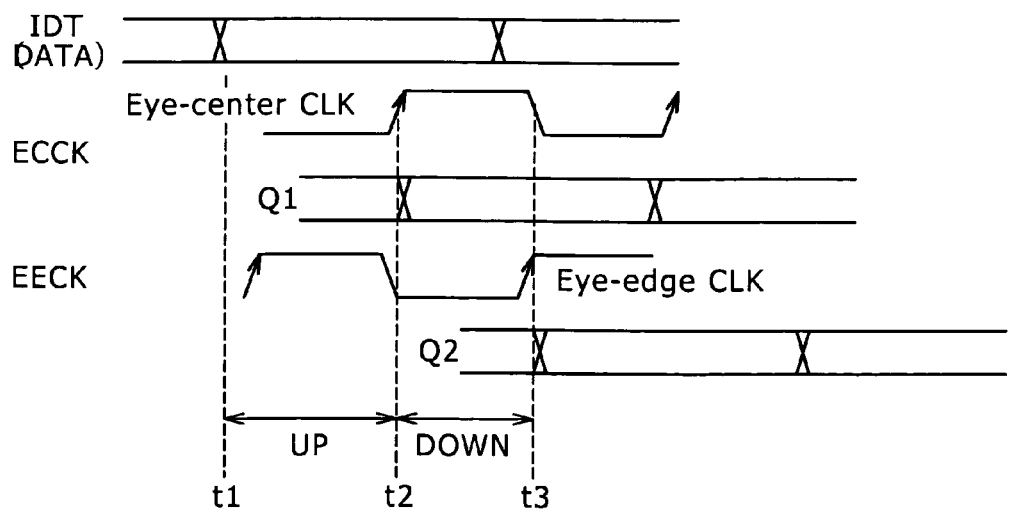
FIG. 2 is a timing diagram showing timing charts of operations carried out by the Hogge PD.
Figure 3:
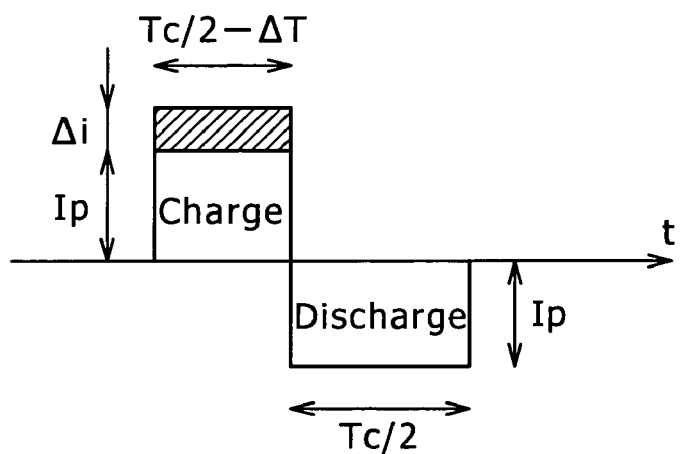
FIG. 3 is a diagram showing a model to be referred to in explanation of the principle of a timing shift generated by the Hogge PD.
Figure 4:
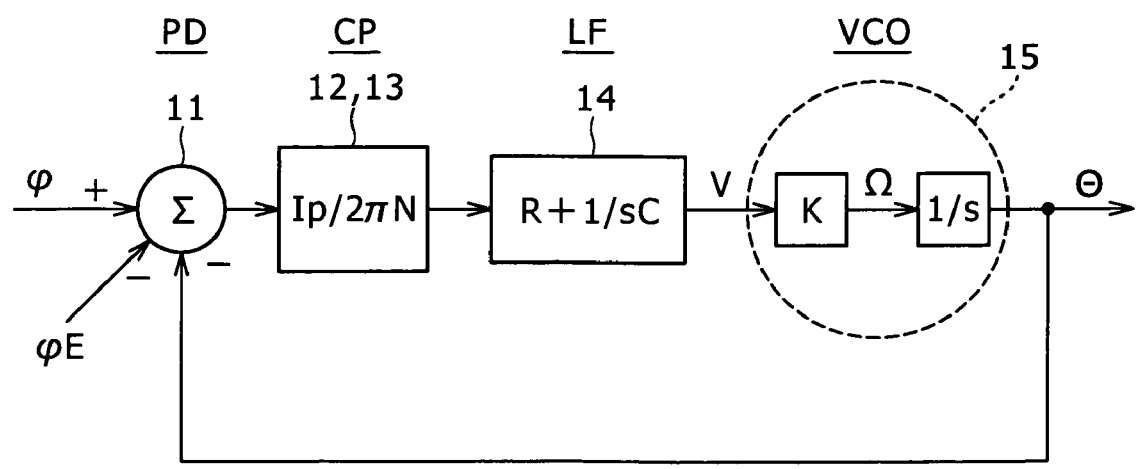
FIG. 4 is a diagram showing a typical system configuration of a CDR feedback loop of the CDR circuit which has the Hogge PD.
Figure 5:
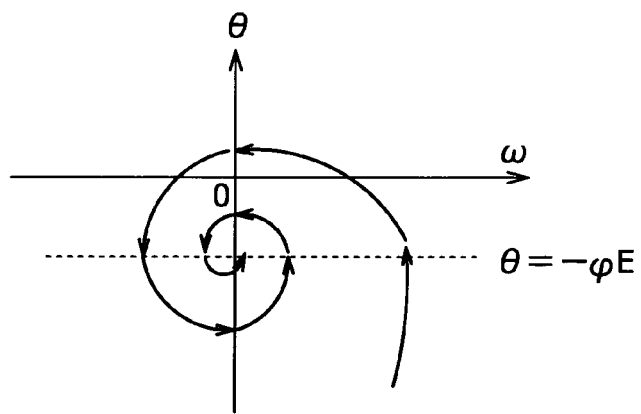
FIG. 5 is a diagram showing a locus drawn on a phase-frequency plane as a locus of the CDR feedback loop of the CDR circuit which has the Hogge PD.
Figure 6:
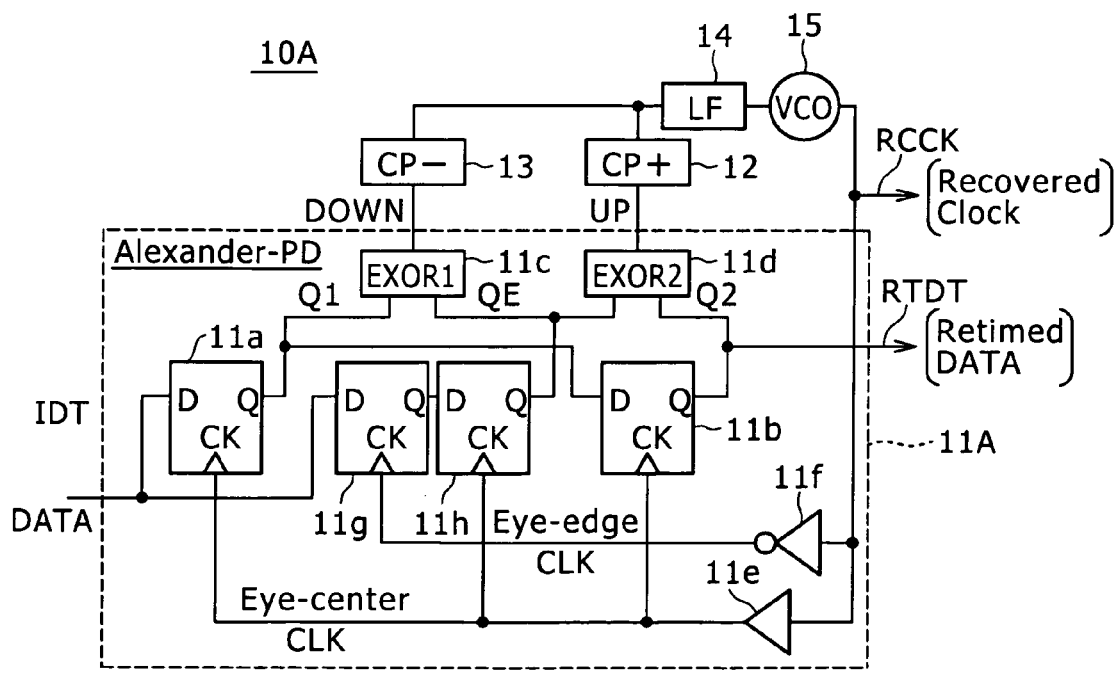
FIG. 6 is a block diagram showing a CDR circuit which makes use of an Alexander PD.
Figure 7:
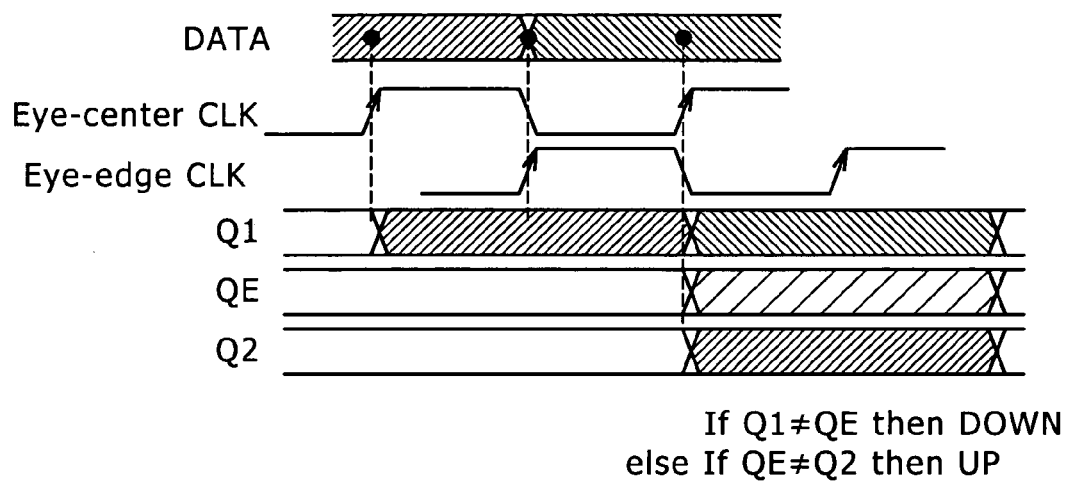
FIG. 7 is a timing diagram showing timing charts of operations carried out by the Alexander PD.
Figure 8:
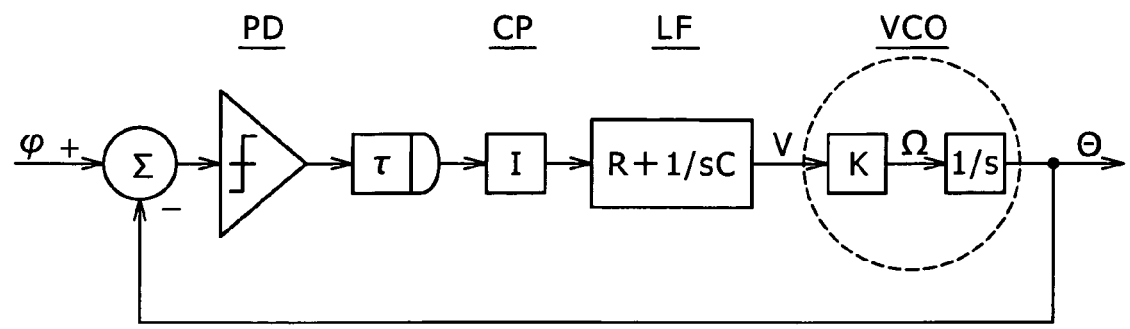
FIG. 8 is a diagram showing a typical system configuration of a CDR feedback loop of the CDR circuit which has the Alexander PD.
Figure 12:
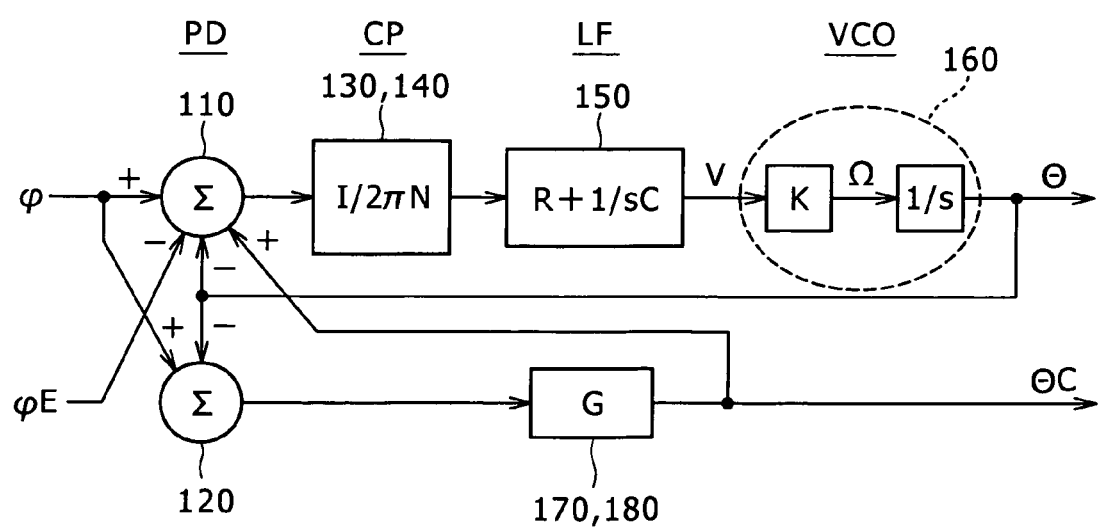
FIG. 12 is a diagram showing a typical system configuration of a CDR feedback loop of the CDR circuit according to the first embodiment.

FIG. 12 is a diagram showing a typical system configuration of a CDR feedback loop of the CDR circuit 100 according to the first embodiment. If the N-bit output signal DLYctrl serving as a delay control signal for controlling the quantity of a delay imposed by the programmable delay line 180 is fixed, the loop system shown in the diagram of FIG. 12 becomes equivalent to the loop system shown in the diagram of FIG. 4. Thus, given a fixed delay control signal, much like the locus shown in the diagram of FIG. 5, the phase and frequency of the clock signal CLK generated by the VCO 160 start at a negative determinate A point shown in the diagram of FIG. 11A. The determinate A point represents a fixed phase offset which is determined by the state of unbalance between the electrical charging current supplied from the first charge pump (CP+) 130 to the LF 150 and the electrical discharging current drawn from the LF 150 to the second charge pump (CP−) 140 as well as the quantity of a delay imposed by the programmable delay line 180.

When the digital filter 170 updates the N-bit output signal DLYctrl serving as the delay control signal, a transition along a helical locus TRK asymptotically approaching a new positive determinate B point as shown in the diagram of FIG. 11A. In order to go around along one cycle of the helical locus TRK, it takes time with a length of $2\pi/\omega n$ where con is a quantity expressed by an equation of Eq. (4).

Thus, when the digital filter 170 updates the N-bit output signal DLYctrl serving as the delay control signal, it takes time with a length of 3 to 10 times $2\pi/\omega n$ in order to arrive at the new determinate B point at which the polarity of the difference in phase between the input data IDT and the clock signal CLK generated by the VCO 160 can be determined. That is to say, it is not until a wait time of 3 to 10 times $2\pi/\omega n$ has lapsed since the change of the N-bit output signal DLYctrl serving as the delay control signal that the polarity of the difference in phase between the input data IDT and the clock signal CLK generated by the VCO 160 can be determined.

The digital filter 170 continues the operation to update the N-bit output signal DLYctrl serving as the delay control signal on the basis of the result of the determination of the polarity of the difference in phase between the input data IDT and the clock signal CLK generated by the VCO 160. Eventually, the digital filter 170 is settled in a state in which, each time the digital filter 170 increases (or decreases) the N-bit output signal DLYctrl serving as the delay control signal by 1 LSB, the result of the determination indicates that the polarity has been inverted but, each time the digital filter 170 decreases (or increases) the N-bit output signal DLYctrl serving as the delay control signal by 1 LSB back to its original value, the result of the determination indicates that the polarity has been back to its original value.

In the state described above, a transition shown in the diagram of FIG. 11A as a transition from the determinate A point to the determinate B point and a transition shown in the diagram of FIG. 11B as a transition from the determinate B point to the determinate A point are carried out repeatedly.

An amplitude θpp shown in the diagrams of FIGS. 11A and 11B as the amplitude of variations of the phase of the clock signal CLK generated by the VCO 16 is about equal to twice a phase change caused by a 1-LSB change of the N-bit output signal DLYctrl serving as the delay control signal. The amplitude θpp can be sufficiently reduced by increasing the resolution power of the programmable delay line 180.

As described before, FIG. 12 shows a typical system configuration of the CDR feedback loop 200 of the CDR circuit 100 according to the first embodiment.

In the CDR circuit 100 according to the first embodiment, the second phase detector 120, the digital filter 170 and the programmable delay line 180 are added to the CDR feedback loop 200 which includes the first phase detector 110, the first charge pump (CP+) 130 (or the second charge pump (CP−) 140), the LF 150 and the VCO 160.

To put it in detail, in the CDR circuit 100 according to the first embodiment, in accordance with a phase-difference polarity detected by the second phase detector 120 as the polarity of a difference between the phase φ of the input data IDT and the phase θ of the clock signal CLK generated by the VCO 160, the digital filter 170 and the programmable delay line 180 generate a cancellation phase difference θC for cancelling a phase error φE detected by the first phase detector 110. The phase error φE which is a difference between the phase φ of the input data IDT and the phase the phase θ of the clock signal CLK is an error caused by unbalance between the electrical charging current supplied from the first charge pump (CP+) 130 to the LF 150 and the electrical discharging current drawn from the LF 150 to the second charge pump (CP−) 140. In the CDR circuit 100, the cancellation phase difference θC for cancelling the phase error φE is inserted by the programmable delay line 180 into the CDR feedback loop 200 which includes the first phase detector 110, the first charge pump (CP+) 130 (or the second charge pump (CP−) 140), the LF 150 and the VCO 160 as described above.

Thus, in accordance with the first embodiment, even if the unbalance between the electrical charging current supplied from the first charge pump (CP+) 130 to the LF 150 and the electrical discharging current drawn from the LF 150 to the second charge pump (CP−) 140 exists due to variations from process to process in processing to manufacture the first charge pump (CP+) 130 and the second charge pump (CP−) 140, unlike a loop system having only the first phase detector 110, the first charge pump (CP+) 130 (or the second charge pump (CP−) 140), the LF 150 and the VCO 160 without including the second phase detector 120, the digital filter 170 and the programmable delay line 180, the position at which the phase of the clock signal CLK generated by the VCO 160 is locked is rarely shifted from the center of each eye of the pattern composing the input data IDT.

Figure 13:
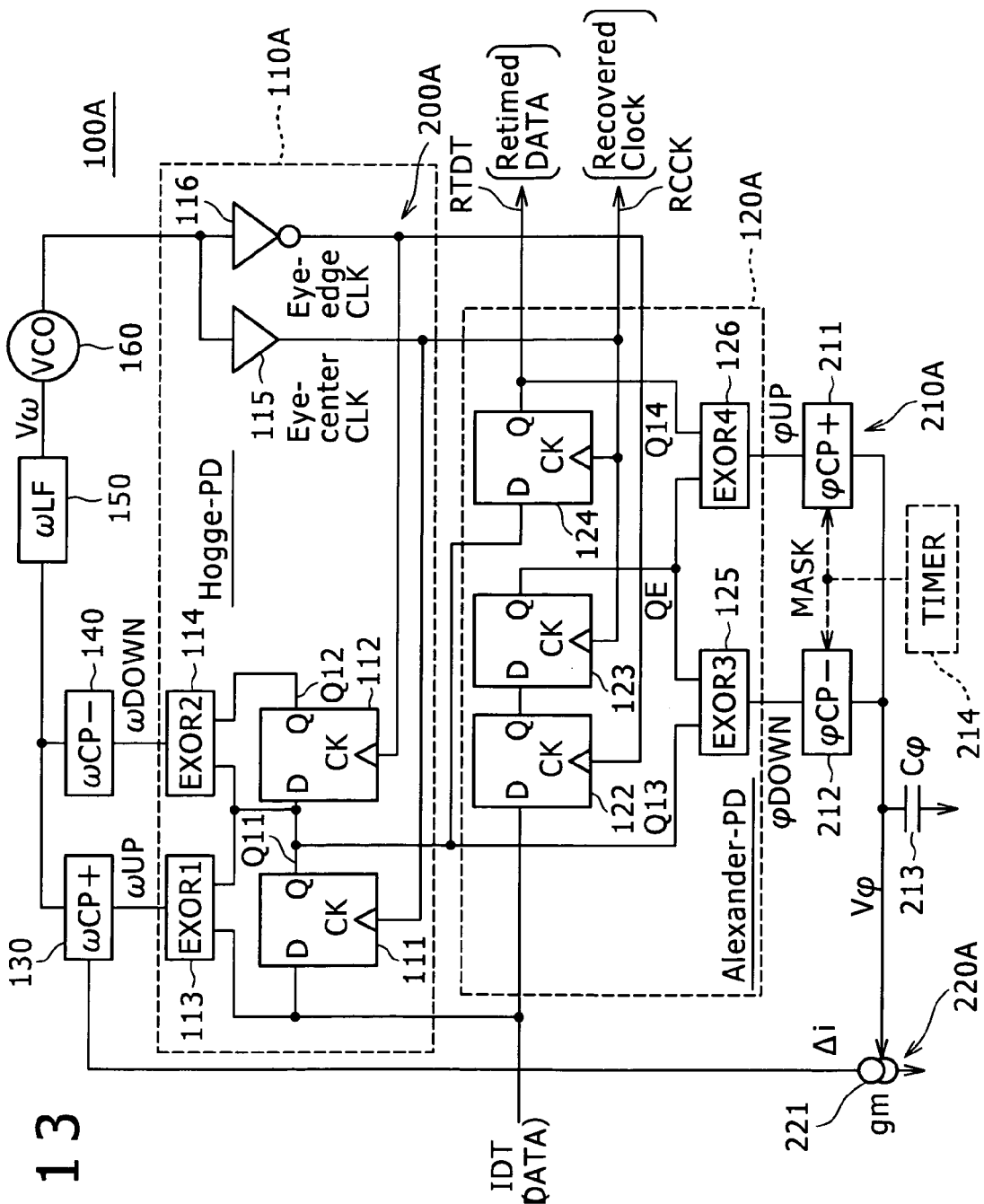
FIG. 13 is a block diagram showing the configuration of a CDR circuit according to a second embodiment of the present invention.

2: Second Embodiment Implementing a Second Typical Configuration of the CDR Circuit FIG. 13 is a block diagram showing the configuration of a CDR circuit 100A according to a second embodiment of the present invention.

Differences between the CDR circuit 100A according to the second embodiment and the CDR circuit 100 according to the first embodiment are explained as follows.

In place of the digital filter 170 supposed to be used as a phase correction information generation section 210A for the CDR circuit 100A, a third charge pump (φCP+) 211, a fourth charge pump (φCP−) 212 and a filter capacitor (Cφ) 213 are employed in the CDR circuit 100A.

In addition, in place of the programmable delay line 180 supposed to be used as a phase correction information addition section 220A for the CDR circuit 100A, a current feedback section 221 is employed in the CDR circuit 100A.

On top of that, the second phase detector 120A employed in the CDR circuit 100A does not have the third DDF 121. This is because the first DFF 111 employed in the first phase detector 110A of the second phase detector 120A also carries out the function of the third DFF 121 in addition to the native function thereof.

In the second phase detector 120A excluding the third DFF 121, the D input terminal of the fourth DFF 122 is connected directly to the line for supplying the input data IDT whereas the D input terminal of the sixth DFF 124 is connected to the Q output terminal of the first DFF 111.

In addition, a specific one of the two input terminals of the third EXOR 125 is connected to the Q output terminal of the first DFF 111.

In the CDR circuit 100A according to the second embodiment, the second phase detector 120A having the configuration described above drives the third charge pump (φCP+) 211 and the fourth charge pump (φCP−) 212, which are used for adjusting the phase of the clock signal CLK generated by the VCO 160, instead of driving a digital filter 170 as is the case with the second phase detector 120 employed in the CDR circuit 100 according to the first embodiment.

The electrical charging current supplied from the third charge pump (φCP+) 211 to the filter capacitor (Cφ) 213 and the electrical discharging current drawn from the filter capacitor (Cφ) 213 to the fourth charge pump (φCP−) 212 are integrated and smoothed by the filter capacitor (C9) 213 in order to generate a phase adjustment signal voltage Vφ.

The second embodiment employs the current feedback section 221 in place of the programmable delay line 180 as explained earlier. The current feedback section 221 increases the electrical charging current supplied from the first charge pump (ωCP+) 130 to the line filter (ωLF) 150 and decreases the electrical discharging current drawn from the line filter (ωLF) 150 to the second charge pump (ωCP−) 140 by a current change Di proportional to the phase adjustment signal voltage Vφ, or decreases the electrical charging current supplied from the first charge pump (ωCP+) 130 to the line filter (ωLF) 150 and increases the electrical discharging current drawn from the line filter (ωLF) 150 to the second charge pump (ωCP−) 140 by the current change Δi.

The unbalance between the electrical charging current supplied from the first charge pump (ωCP+) 130 to the line filter (ωLF) 150 and the electrical discharging current drawn from the line filter (ωLF) 150 to the second charge pump (ωCP−) 140 in the CDR feedback loop including the first phase detector 110A according to the second embodiment is a phase offset generated by the first phase detector 110A as the offset error φ expressed by Eq. (3). Thus, the function of the current feedback section 221 is equivalent to that of the programmable delay line 180 employed in the first embodiment.

Figure 14:
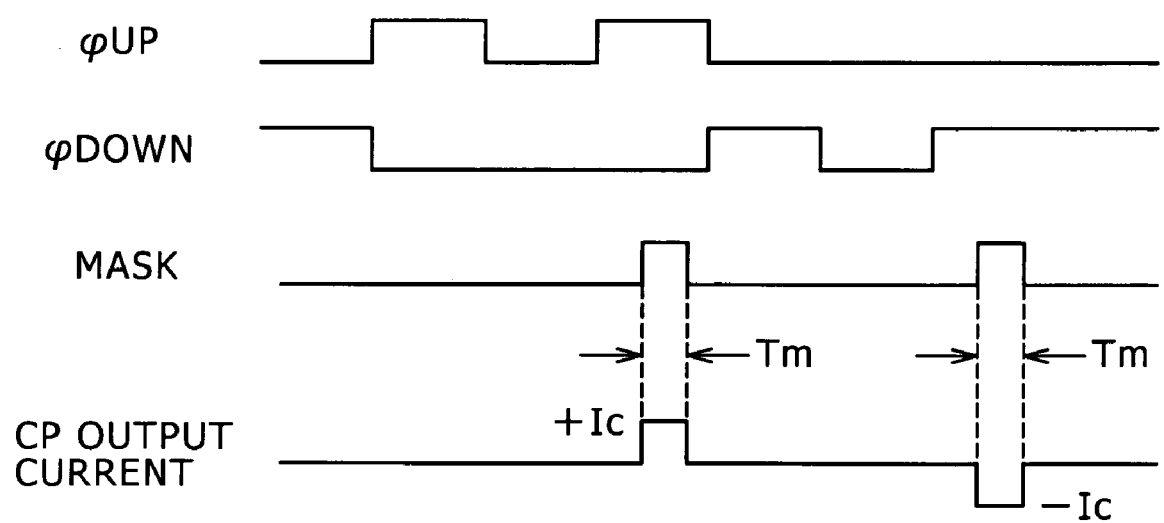
FIG. 14 is a timing diagram showing timing charts of operations carried out by the CDR circuit according to the second embodiment.

It is to be noted that, in the second embodiment, each the third charge pump (φCP+) 211 and the fourth charge pump (φCP−) 212 can be driven only during a period Tm defined by a mask signal MASK generated by a timer circuit 214 in an intermittent driving operation as shown for example in a timing diagram of FIG. 14.

In this intermittent driving operation, while the CDR feedback loop including the first phase detector 110A is making a transition to a determinate point, the value of the phase adjustment signal voltage Vφ can be fixed. It is thus possible to exhibit behaviors equivalent to those displayed by the digital filter 170 by waiting for the CDR feedback loop to get settled at the determinate point and make the next transition.

The current change Δi resulted in from one φCP driving operation to drive the third charge pump (φCP+) 211 or the fourth charge pump (φCP−) 212 is expressed by Eq. (5) given below. In Eq. (5), reference notation gm denotes a coefficient used for converting the phase adjustment signal voltage Vφ into the current change Δi, reference notation Ic denotes the height of the output current pulse generated by the third charge pump (φCP+) 211 or the fourth charge pump (φCP−) 212 and reference notation Tm denotes the length of the period of the driving operation. The expression on the right-hand side of Eq. (5) is substituted into Eq. (3) to replace the term Δi to yield Eq. (6) given as follows.

$$\Delta i = gm \Delta V\phi = \frac{gmTmIc}{C\phi} \quad (5)$$

$$\phi E \sim \frac{\pi gmTmIc}{C\phi Ip} \quad (6)$$

$$\frac{3.14 \times 0.1 \text{ ns}}{10 \text{k}\Omega \times 1 \text{ pF}} = 0.03$$

In the CDR feedback loop according to the second embodiment, the phase displays a vibrating behavior in the same way as the case of the first embodiment in which a phase change caused by a 1-LSB variation of the N-bit output signal DLYctrl generated by the digital filter 170 to serve as a delay control signal for controlling the quantity of the programmable delay imposed by the programmable delay line 180 is equal to a value expressed by Eq. (6) as the value of φE. By reducing the values of the coefficient gm and the driving operation period Tm, however, the value of φE representing the amplitude of the vibration of the phase can be decreased sufficiently.

Figure 15:
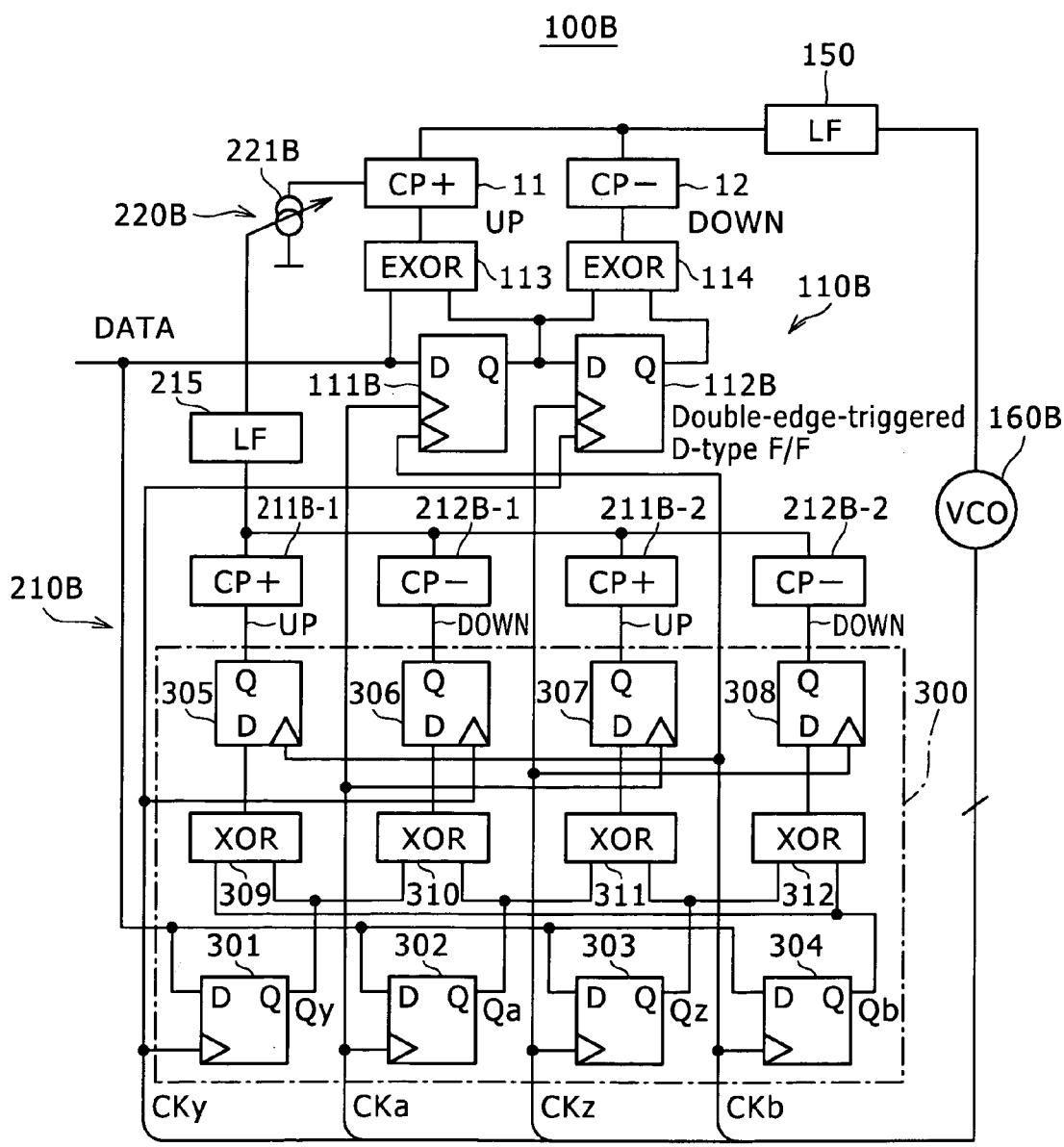
FIG. 15 is a block diagram showing the configuration of a CDR circuit according to a third embodiment of the present invention.

3: Third Embodiment Implementing a Third Typical Configuration of the CDR Circuit FIG. 15 is a block diagram showing the configuration of a CDR circuit 100B according to a third embodiment of the present invention.

The CDR circuit 100B according to the third embodiment has differences from the CDR circuit 100 according to the first embodiment and the CDR circuit 100A according to the second embodiment as explained below.

The VCO employed in the CDR circuit 100B according to the third embodiment is a multi-phase VCO 160B for generating four clock signals CKa, CKb, CKy and CKz which have phases shifted from each other by an angle of 90 degrees. In addition, the CDR circuit 100B employs a modified second phase detector 300 associated with the multi-phase VCO 160B as a substitute for the second phase detector 120A.

In the case of the third embodiment, the frequency of the clock signals CKa, CKb, CKy and CKz generated by the multi-phase VCO 160B is half of the frequency of the clock signal CLK generated by the VCO 160 employed in the first embodiment and the frequency of the clock signal CLK generated by the VCO 160A employed in the second embodiment. Thus, the process to manufacture the multi-phase VCO 160B is easier than the process to manufacture the VCOs 160 and 160A.

In addition, in the case of the third embodiment, the first phase detector 110B employs a first double-edge trigger DFF 111B and a second double-edge trigger DFF 112B which are each a DDF of a double-edge trigger type.

The modified second phase detector 300 employs a third DFF 301, a fourth DFF 302, a fifth DFF 303, a sixth DFF 304, a seventh DFF 305, an eighth DFF 306, a ninth DFF 307 and a tenth DFF 308.

On top of that, the modified second phase detector 300 also employs a third EXOR 309, a fourth EXOR 310, a fifth EXOR 311 and a sixth EXOR 312 which each have a function to compare two input signals supplied thereto with each other.

In addition, the phase correction information generation section 210B employed in the CDR circuit 100B has a third charge pump ($\phi$CP+) 211B-1, a third charge pump ($\phi$CP+) 211B-2, a fourth charge pump ($\phi$CP−) 212B-1, a fourth charge pump ($\phi$CP−) 212B-2 and an LF 215.

On top of that, the CDR circuit 100B employs a phase correction information addition section 220B and a current feedback section 221B.

In the modified second phase detector 300, the D input terminals of the third DFF 301, the fourth DFF 302, the fifth DFF 303 and the sixth DFF 304 are connected to a line for supplying the input data IDT.

The Q output terminal of the third DFF 301 is connected to a specific one of the two input terminals of the third EXOR 309 and a specific one of the two input terminals of the fourth EXOR 310.

The Q output terminal of the fourth DFF 302 is connected to the other input terminal of the fourth EXOR 310 and a specific one of the two input terminals of the fifth EXOR 311.

The Q output terminal of the fifth DFF 303 is connected to the other input terminal of the fifth EXOR 311 and a specific one of the two input terminals of the sixth EXOR 312.

The Q output terminal of the sixth DFF 304 is connected to the other input terminal of the third EXOR 309 and the other input terminal of the sixth EXOR 312.

The output terminal of the third EXOR 309 is connected to the D input terminal of the seventh DFF 305 whereas the Q output terminal of the seventh DFF 305 is connected to the input terminal of the third charge pump ($\phi$CP+) 211B-1.

The output terminal of the fourth EXOR 310 is connected to the D input terminal of the eighth DFF 306 whereas the Q output terminal of the eighth DFF 306 is connected to the input terminal of the fourth charge pump ($\phi$CP−) 212B-1.

The output terminal of the fifth EXOR 311 is connected to the D input terminal of the ninth DFF 307 whereas the Q output terminal of the ninth DFF 307 is connected to the input terminal of the third charge pump ($\phi$CP+) 211B-2.

The output terminal of the sixth EXOR 312 is connected to the D input terminal of the tenth DFF 308 whereas the Q output terminal of the tenth DFF 308 is connected to the input terminal of the fourth charge pump ($\phi$CP−) 212B-2.

The output terminals of the third charge pump ($\phi$CP+) 211B-1, the third charge pump ($\phi$CP+) 211B-2, the fourth charge pump ($\phi$CP−) 212B-1 and the fourth charge pump ($\phi$CP−) 212B-2 are connected to the input terminal of the LF 215 whereas the output terminal of the LF 215 is connected to the current feedback section 221B.

The clock signal CKy generated by the multi-phase VCO 160B as one of the four clock signals CKa, CKb, CKy and CKz having phases shifted from each other by an angle of 90 degrees as described before is connected to the clock terminals of the third DFF 301 and the eighth DFF 306 as well as a specific one of the clock terminals of the second double-edge trigger DFF 112B.

The clock signal CKa generated by the multi-phase VCO 160B as another one of the four clock signals CKa, CKb, CKy and CKz having phases shifted from each other by an angle of 90 degrees as described before is connected to the clock terminals of the fourth DFF 302 and the ninth DFF 307 as well as a specific one of the clock terminals of the first double-edge trigger DFF 111B.

The clock signal CKz generated by the multi-phase VCO 160B as a further one of the four clock signals CKa, CKb, CKy and CKz having phases shifted from each other by an angle of 90 degrees as described before is connected to the clock terminals of the fifth DFF 303 and the tenth DFF 308 as well as the other clock terminal of the second double-edge trigger DFF 112B.

The clock signal CKb generated by the multi-phase VCO 160B as a still further one of the four clock signals CKa, CKb, CKy and CKz having shifted from each other by an angle of 90 degrees as described before is connected to the clock terminals of the sixth DFF 304 and the seventh DFF 305 as well as the other clock terminal of the first double-edge trigger DFF 111B.

Figure 16:
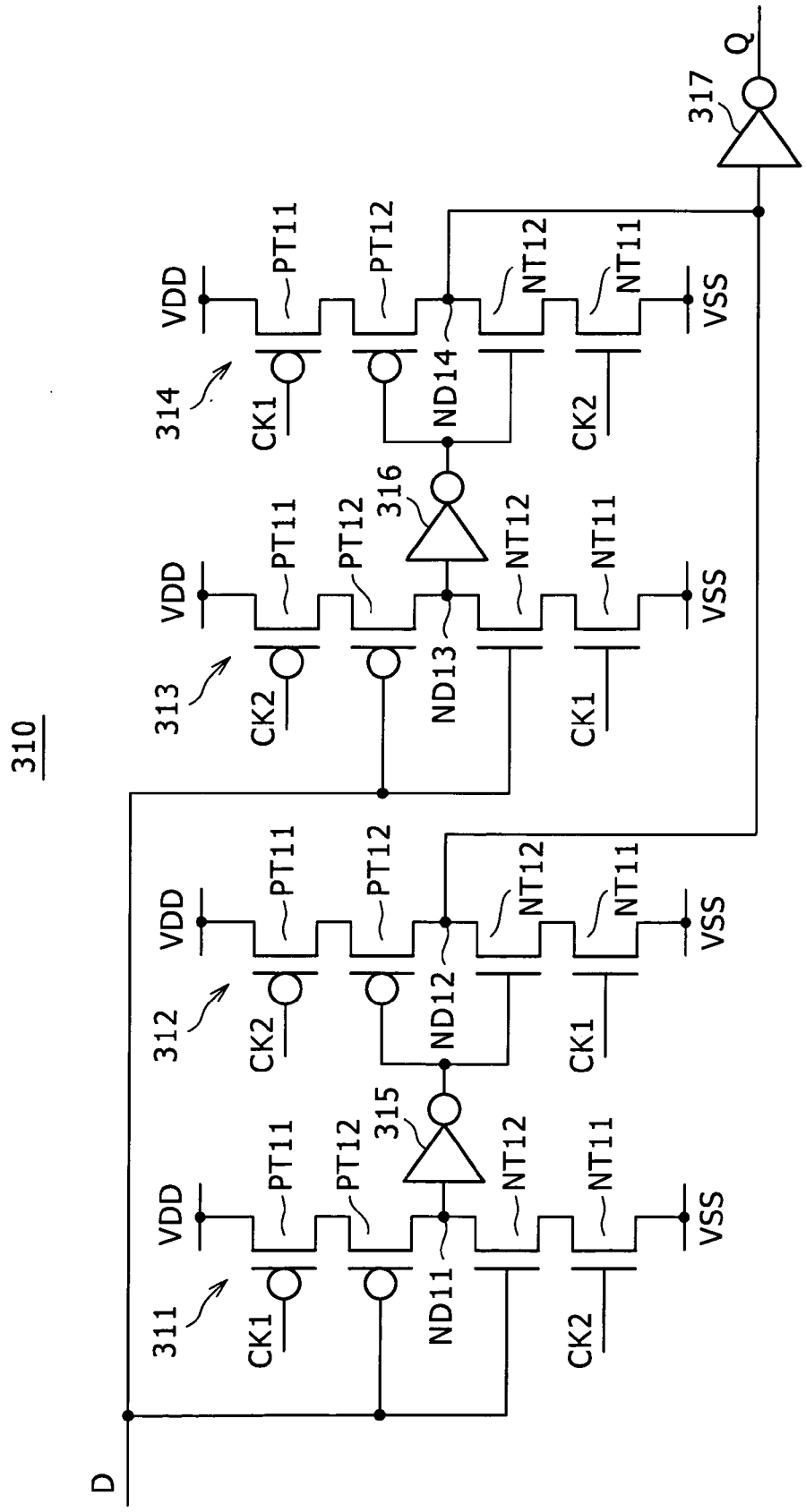
FIG. 16 is a circuit diagram showing a typical configuration of a double-edge-triggered DFF (D-type flip-flop) employed in the CDR circuit to serve as a DFF according to the third embodiment.

FIG. 16 is a circuit diagram showing a typical configuration of the first double-edge trigger DFF 111B (or the second double-edge trigger 112B) employed in the third embodiment.

The first double-edge trigger DFF 111B (or the second double-edge trigger 112B) shown in the circuit diagram of FIG. 16 employs four clocked inverters 311 to 314 and three inverters 315 to 317.

Each of the four clocked inverters 311 to 314 is configured to employ PMOS (P-channel MOS) transistors PT11 and PT12 as well as NMOS (N-channel MOS) transistors NT11 and NT12. The PMOS transistor PT11, the PMOS transistor PT12, the NMOS transistor NT11 and the NMOS transistor NT12 are connected in series between a power supply VDD and a reference electric potential VSS.

The drain of the PMOS transistor PT12 in each of the N clocked inverters CINV is connected to the drain of the NMOS transistor NT12 in the same clocked inverter CINV to form a connection node ND11. To be more specific, the connection nodes ND11 to ND 14 are formed in the four clocked inverters 311 to 314 respectively.

The gate of the PMOS transistor PT11 employed in the first clocked inverter 311 receives a first clock signal CK1 whereas the gate of the NMOS transistor NT11 employed in the same first clocked inverter 311 receives a second clock signal CK2. In the following description, the technical term 'first clock signal CK1' is intended to imply the clock signal CKa or CKy shown in the block diagram of FIG. 15 whereas the technical term 'second clock signal CK2' is intended to imply the clock signal CKb or CKz shown in the same block diagram.

The gates of the PMOS transistor PT12 and the NMOS transistor NT12 which are employed in the first clocked inverter 311 are connected to the D input terminal of the first double-edge trigger DFF 111B (or the second double-edge trigger DFF 112B).

The connection node ND11 of the first clocked inverter 311 is connected by the inverter 315 to the gates of the PMOS transistor PT12 and the NMOS transistor NT12 which are employed in the second clocked inverter 312.

The gate of the PMOS transistor PT11 employed in the second clocked inverter 312 receives the second clock signal CK2 whereas the gate of the NMOS transistor NT11 employed in the same second clocked inverter 312 receives the first clock signal CK1.

The connection node ND12 of the second clocked inverter 312 is connected by the inverter 317 to the Q output terminal of the first double-edge trigger DFF 111B (or the second double-edge trigger DFF 112B).

The gate of the PMOS transistor PT11 employed in the third clocked inverter 313 receives the second clock signal CK2 whereas the gate of the NMOS transistor NT11 employed in the third clocked inverter 313 receives the first clock signal CK1.

The gates of the PMOS transistor PT12 and the NMOS transistor NT12 which are employed in the third clocked inverter 313 are connected to the D input terminal of the first double-edge trigger DFF 111B (or the second double-edge trigger DFF 112B).

The connection node ND13 of the third clocked inverter 313 is connected by the inverter 316 to the gates of the PMOS transistor PT12 and the NMOS transistor NT12 which are employed in the fourth clocked inverter 314.

The gate of the PMOS transistor PT11 employed in the fourth clocked inverter 314 receives the first clock signal CK1 whereas the gate of the NMOS transistor NT11 employed in the fourth clocked inverter 314 receives the second clock signal CK2.

The connection node ND14 of the fourth clocked inverter 314 is connected by the inverter 317 to the Q output terminal of the first double-edge trigger DFF 111B (or the second double-edge trigger DFF 112B).

The first clock signal CK1 and the second clock signal CK2 have phases shifted from each other by an angle of 180 degrees. That is to say, the first clock signal CK1 and the second clock signal CK2 are clock signals complementary to each other. By triggering the first double-edge trigger DFF 111B (and the second double-edge trigger DFF 112B) to operate at the rising edge of the first clock signal CK1 (that is, the falling edge of the second clock signal CK2) and the rising edge of the second clock signal CK2 (that is, the falling edge of the second clock signal CK2), it is possible to provide the first double-edge trigger DFF 111B (and the second double-edge trigger DFF 112B) with a function to latch the logic value of a signal supplied to the D input terminal of the first double-edge trigger DFF 111B (and the second double-edge trigger DFF 112B) and to output the latched value to the Q output terminal of the first double-edge trigger DFF 111B (and the second double-edge trigger DFF 112B) with a timing determined by the so-called double-edge trigger.

Figure 17:
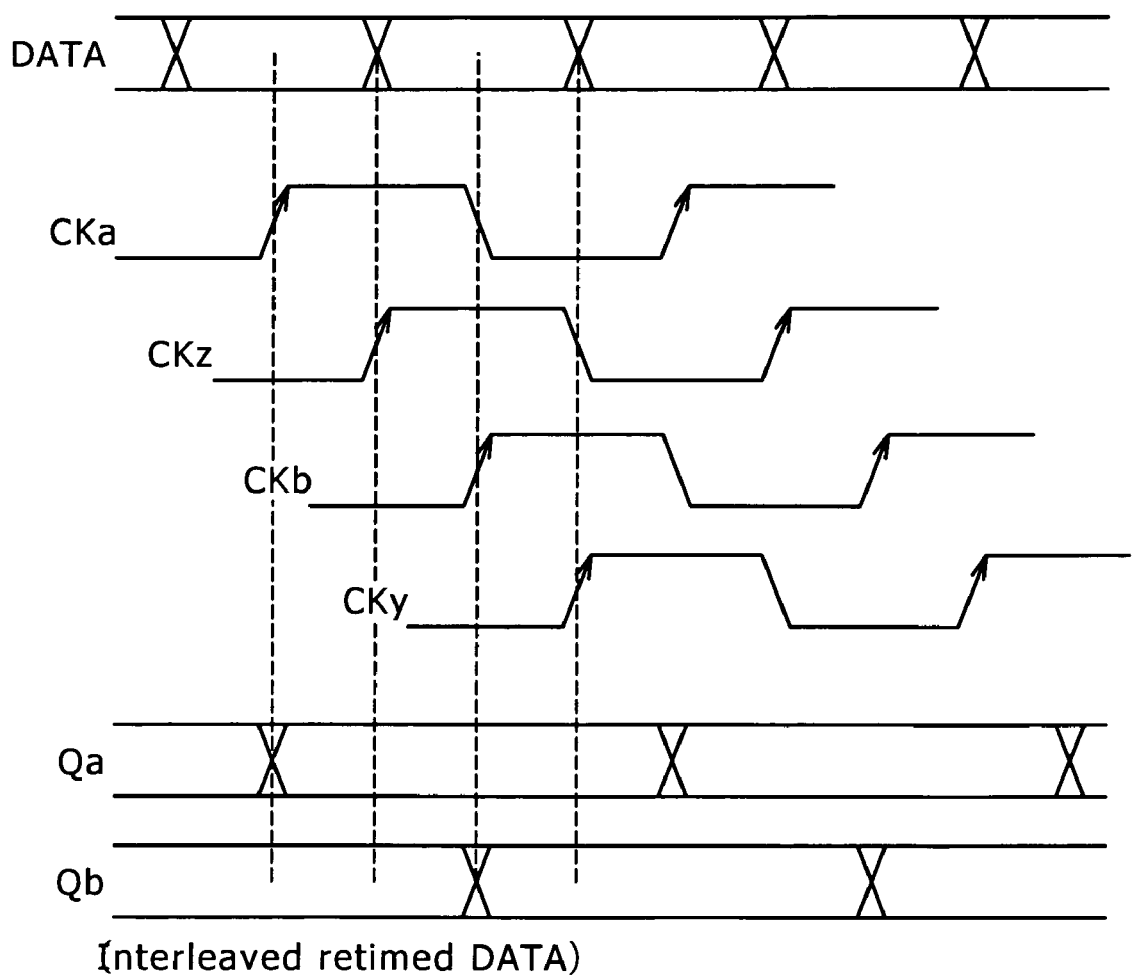
FIG. 17 is a timing diagram showing timing charts of input data, VCO clock signals and retimed data in the third embodiment.

FIG. 17 is a timing diagram showing timing charts of the input data IDT denoted by reference notation DATA, the clock signals CKa, CKz, CKb and CKy generated by the VCO 160B as well as retimed data Qa and Qb output by the fourth DFF 302 and the sixth DFF 304 respectively in the third embodiment.

As shown in the timing diagram of FIG. 17, the clock signals CKa, CKz, CKb and CKy having phases shifted from each other by an angle of 90 degrees are sampling clock signals for latching the input data IDT having a pattern of successive eyes with timings corresponding to positions in close proximity to the center of any specific one of the eyes, the edge of the specific eye, the center of following eye immediately lagging behind the specific eye and the edge of the following eye respectively.

Data Qa and data Qb which are shown in the timing diagram of FIG. 17 serve as retimed data RTDT. As shown in the diagram of FIG. 15, the data Qa is the input data IDT latched in the fourth DFF 302 with a timing determined by the clock signal CKa whereas and the data Qb is the input data IDT latched in the sixth DFF 304 with a timing determined by the clock signal CKb.

The third EXOR 309 compares the data Qy, which has been latched in the third DFF 301 with a timing determined by the clock signal CKy, with the retimed data Qb at an eye center immediately preceding the clock signal CKy in order to generate another up signal UP latched in the seventh DFF 305.

The fourth EXOR 310 compares the data Qy, which has been latched in the third DFF 301 with a timing determined by the clock signal CKy, with the retimed data Qa at an eye center immediately succeeding the clock signal CKy in order to generate another down signal DOWN latched in the eighth DFF 306.

The fifth EXOR 311 compares the data Qz, which has been latched in the fifth DFF 303 with a timing determined by the clock signal CKz with the retimed data Qa at an eye center immediately preceding the clock signal CKz in order to generate a further up signal UP latched in the ninth DFF 307.

The sixth EXOR 312 compares the data Qz, which has been latched in the fifth DFF 303 with a timing determined by the clock signal CKz, with the retimed data Qb at an eye center immediately succeeding the clock signal CKz in order to generate a further down signal DOWN latched in the tenth DFF 308.

4: Fourth Embodiment Implementing a Typical Configuration of a CMU

Figure 18:
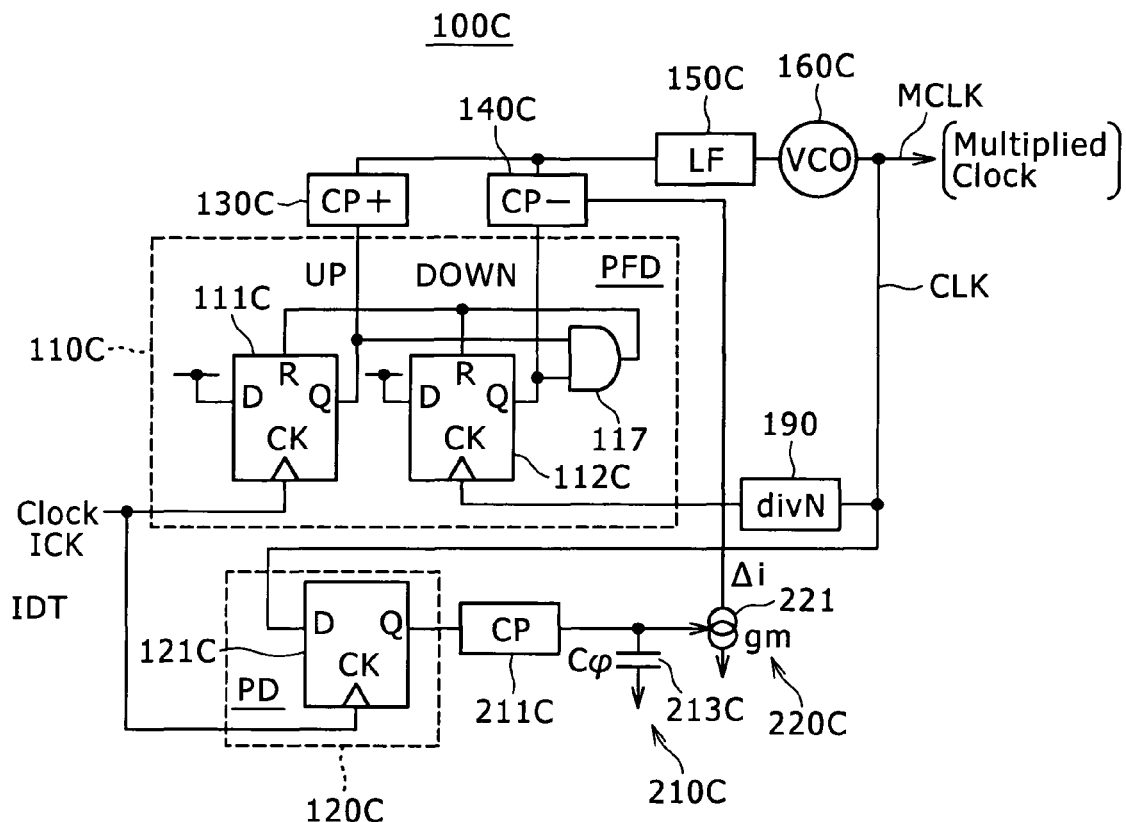
FIG. 18 is a block diagram showing the configuration of a multiplied-frequency clock generation circuit also referred to as a CMU (Clock Multiplying Unit) according to a fourth embodiment of the present invention.

FIG. 18 is a block diagram showing the configuration of a multiplied-frequency clock generation circuit 100C also referred to as a CMU (Clock Multiplying Unit) according to a fourth embodiment of the present invention.

The following description explains the configuration of the multiplied-frequency clock generation circuit (CMU) 100C and functions carried out by the CMU 100C.

In order to make the following description of the multiplied-frequency clock generation circuit 100C easy to understand, elements corresponding to their counterparts employed in the CDR circuit 100, the CDR circuit 100A and the CDR circuit 100B according to the first to third embodiments respectively are denoted by the same reference numerals and symbols as the counterparts.

The multiplied-frequency clock generation circuit 100C employs a first phase detector 110C, a second phase detector 120C, a first charge pump (CP+) 130C, a second charge pump (CP−) 140C, a loop filter 150C, a VCO 160C and a frequency divider 190. In addition, the multiplied-frequency clock generation circuit 100C also has a phase correction information generation section 210C and a phase correction information addition section 220C.

The phase correction information generation section 210C includes a third charge pump (CP) 211C and a filter capacitor 213C whereas the phase correction information addition section 220C includes a current feedback section 221.

A regular input clock signal ICK is supplied to the multiplied-frequency clock generation circuit (CMU) 100C as the input data IDT. The multiplied-frequency clock generation circuit 100C generates a multiplied-frequency clock signal MCLK having a frequency equal to N times the frequency of the input clock signal ICK.

As the first phase detector 110e, the multiplied-frequency clock generation circuit 100C employs a circuit referred to as a PFD to replace the Hogge phase detector which serves as the first phase detector in the first to third embodiments described earlier. The first phase detector 110C has a first DFF 111C, a second DFF 112C and an AND circuit 117.

The PFD compares the phase of the input clock signal ICK with the phase of a clock signal which is generated by the frequency divider 190 as a divided-frequency clock signal having a frequency equal to (1/N) times the frequency of the clock signal CLK output by the VCO 160C. In the PFD, the first DFF 111C generates an up pulse serving as the up signal UP whereas the second DFF 112C generates a down pulse serving as the down signal DOWN.

As will be described later in detail, each of the up pulse generated by the first DFF 111C and the down pulse generated by the second DFF 112C is also referred to as a reset pulse which is a name derived from the fact that, in the PFD 110C, the up and down pulses are used to generate a reset signal for both the first DFF 111C and the second DFF 112C by the AND circuit 117 imposing a signal propagation delay determining the simultaneous ends of the up and down pulses.

If the edge of the input clock signal ICK coincides with the edge of the divided-frequency clock signal, the first DFF 111C generates the up pulse as the up signal UP at the same time as the time at which the second DFF 112C generates the down pulse as the down signal DOWN. Since the up and down pulses are reset simultaneously at the same time by the reset signal generated by the AND circuit 117, the up pulse has a width equal to the width of the down pulse. In this case, the width of the pulse of the reset signal is equal to the width of the up and down pulses.

Figure 19:
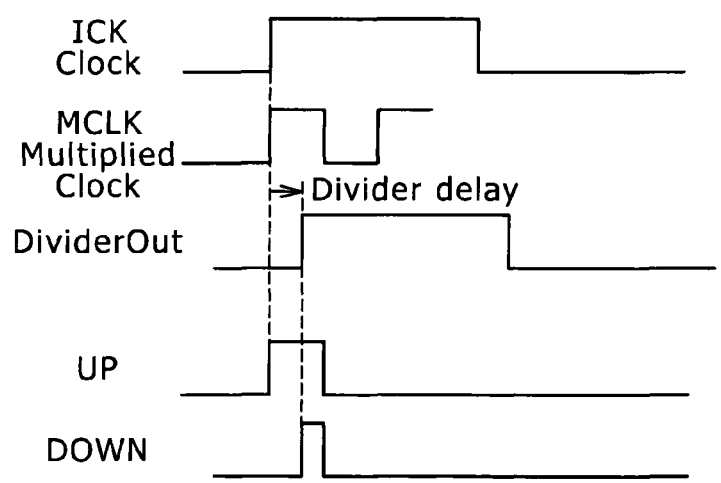
FIG. 19 is a timing diagram showing timing charts in a state in which a second PD employed in the fourth embodiment completes a proper electrical charging process to supply a current to a capacitor Cφ in order to align the phase of a multiplied-frequency clock signal to the phase of an input clock signal.

If the edge of the input clock signal ICK leads ahead of the edge of the edge of the divided-frequency clock signal as shown in a timing diagram of FIG. 19, the first DFF 111C generates the up pulse as the up signal UP at a time earlier than the time at which the second DFF 112C generates the down pulse as the down signal DOWN. Since the up and down pulses are reset simultaneously at the same time by the reset signal generated by the AND circuit 117, the up pulse has a width greater than the width of the down pulse. To be more specific, the width of the up pulse is greater than the width of the down pulse by a difference in timing between the appearance of the edge of the input clock signal ICK and the appearance of the edge of the divided-frequency clock signal. In this case, the width of the pulse of the reset signal is equal to the width of the down pulse. That is to say, the down pulse lags behind the up pulse, forming the reset pulse at the output terminal of the AND circuit 117 in conjunction with the up pulse.

If the edge of the input clock signal ICK lags behind the edge of the edge of the divided-frequency clock signal as shown in none of the figures, on the other hand, the first DFF 111C generates the up pulse as the up signal UP at a time later than the time at which the second DFF 112C generates the down pulse as the down signal DOWN. Since the up and down pulses are reset simultaneously at the same time by the reset signal generated by the AND circuit 117, the up pulse has a width smaller than the width of the down pulse. To be more specific, the width of the down pulse is greater than the width of the up pulse by a difference in timing between the appearance of the edge of the input clock signal ICK and the appearance of the edge of the divided-frequency clock signal. In this case, the width of the pulse of the reset signal is equal to the width of the up pulse. That is to say, the up pulse lags behind the down pulse, forming the reset pulse at the output terminal of the AND circuit 117 in conjunction with the down pulse.

With the up signal UP set at the high level, the first charge pump (CP+) 130C supplies an electrical charging current to the loop filter 150C whereas, with the down signal DOWN set at the high level, the second charge pump (CP−) 140C draws an electrical discharging current from the loop filter 150C. Thus, the loop filter 150C feeds back an analog signal to the VCO 160C. The analog signal has a magnitude which is proportional to the difference in phase between the input clock signal ICK and the divided-frequency clock signal.

Much like the CDR feedback loop having a Hogge phase detector, the difference in phase between the input clock signal ICK and the divided-frequency clock signal is generated due to unbalance between the electrical charging current supplied by the first charge pump (CP+) 130C to the loop filter 150C and the electrical charging current drawn by the second charge pump (CP−) 140C from the loop filter 150C. In addition, because of a time delay introduced by the frequency divider 190, the phase of the multiplied-frequency clock signal MCLK does not typically match the phase of the input clock signal ICK used as the input data IDT.

In the fourth embodiment, the second phase detector 120C is added to the CDR feedback loop to serve as a PD (Phase Detector) for comparing the phase of the multiplied-frequency clock signal MCLK with the phase of the input clock signal ICK.

In addition, in the fourth embodiment, a third DFF 121C is employed to serve as the PD 120C. If the level of a value latched in the third DFF 121C as the value of the multiplied-frequency clock signal MCLK on the rising edge of the input data IDT is low, the phase of the multiplied-frequency clock signal MCLK is determined to be a phase lagging behind the phase of the input clock signal ICK. If the level of a value latched in the third DFF 121C as the value of the multiplied-frequency clock signal MCLK on the rising edge of the input data IDT is high, on the other hand, the phase of the multiplied-frequency clock signal MCLK is determined to be a phase leading ahead of the phase of the input clock signal ICK.

If the phase of the multiplied-frequency clock signal MCLK is determined to be a phase leading ahead of the phase of the input clock signal ICK, in the phase correction information generation section 210C, the third charge pump (CP) 211C supplies an electrical charging current to the filter capacitor (Cφ) 213C. If the phase of the multiplied-frequency clock signal MCLK is determined to be a phase lagging behind the phase of the input clock signal ICK, on the other hand, in the phase correction information generation section 210C, a third charge pump (CP) 211C draws an electrical discharging current from the filter capacitor (Cφ) 213C.

The current feedback section 221 (also referred to as a Gm circuit) employed in the phase correction information addition section 220C is a section for converting a voltage Vφ appearing on the filter capacitor (C9) 213C into a current Δi and for increasing or decreasing the magnitude of the electrical discharging current drawn by the second charge pump (CP−) 140C from the loop filter 150C by the current Δi.

FIG. 19 is a timing diagram showing timing charts in a state in which the second PD (Phase Detector) 120C employed in the fourth embodiment completes a proper electrical charging process to supply an electrical charging current to the filter capacitor Cφ denoted by reference numeral 213C in order to align the phase of the multiplied-frequency clock signal MCLK to the phase of the input data IDT serving as the input clock signal ICK.

As shown in the diagram of FIG. 19, the pulse of the up signal UP starts on the rising edge of the input clock signal ICK whereas the pulse of the down signal DOWN starts on the rising edge of the divided-frequency clock signal output by the frequency divider 190 with a timing which lags behind the rising edge of the input clock signal ICK. Since the pulse of the up signal UP and the pulse of the down signal DOWN end at the same time, the width of the pulse of the up signal UP is greater than the width of the pulse of the down signal DOWN.

Since the third charge pump (CP) 211C is supplying an electrical charging current to the capacitor (Cp) 213C to gradually generate a voltage Vp on the capacitor Cp, however, through the current feedback section 221, the voltage Vp increases the magnitude of the electrical discharging current drawn by the second charge pump (CP−) 140C from the LC 150C to a level higher than the electrical charging current supplied by the first charge pump (CP+) 130C to the LC 150C. Thus, the frequency of the clock signal CLK generated by the VCO 160C changes and this change in frequency is fed back to the third charge pump (CP) 211C by way of the third DFF 121C. As a result, the net electrical charging current supplied by the third charge pump (CP) 211C to the capacitor Cp becomes equal to 0.

That is to say, with the net electrical charging current supplied by the third charge pump (CP) 211C to the capacitor Cφ becoming equal to 0, the CDR loop enters a steady state in which the frequency and phase of the clock signal CLK generated by the VCO 160C do not vary.

Since the rising edge of the input clock signal ICK coincides with the rising edge of the multiplied-frequency clock signal MCLK, the second PD (phase detector) 120C supplies a high-level output signal statistically as many times as a low-level output signal to the third charge pump (CP) 211C. Thus, the voltage V9 generated on the capacitor Cφ hardly varies either. As a result, the steady state is sustained.

In accordance with the fourth embodiment, it is possible to generate a multiplied-frequency clock signal MCLK having a rising edge aligned to the rising edge of the input clock signal ICK.

Figure 20:
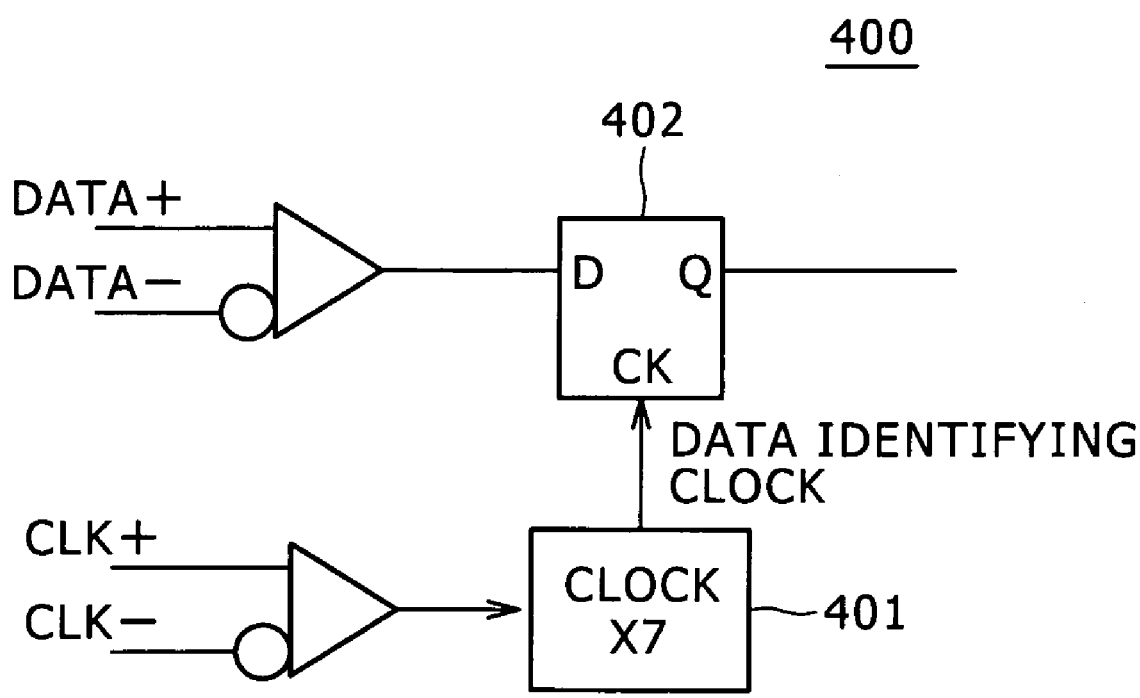
FIG. 20 is a diagram showing a typical example of applying the fourth embodiment to a clock-7-multiplying circuit employed in an LVDS receiver circuit.

In addition, if the fourth embodiment is applied to a clock-7-multiplying circuit 401 employed in an LVDS receiver circuit 400 shown in a diagram of FIG. 20, it is possible to generate a data identifying clock signal which is correctly settled for input data.

In accordance with the embodiments described so far, it is possible to obtain the following effects.

In accordance with the CDR configurations provided by the embodiments, it is possible to generate a recovered clock signal with a phase which has no difference from the phase of the input clock signal and has a small amplitude.

In addition, it is possible to create a CDR circuit having an excellent jitter-proof characteristic. The band of responses provided by the recovered clock signal as responses to changes of the phase of the input data can be set as a broad band independently of suppression of the amplitude of the phase of the recovered clock signal. In addition, since the CDR circuit does not desire a capacitive element having a large capacitance, the process of manufacturing the IC (Integrated Circuit) can also be carried out with ease as well.

On top of that, in accordance with the embodiments, the CDR circuit can be configured to employ a VCO which vibrates at a frequency equal to half the rate of the input data. Thus, the CDR circuit exhibits a few-jitter characteristic.

In addition, in accordance with one of the embodiments, it is possible to generate a multiplied-frequency clock signal that has a rising edge coinciding with the rising edge of the input clock signal.

On top of that, by applying the fourth embodiment to an LVDS receiver as shown in the diagram of FIG. 20, it is possible make a highly reliable receiver which has large setup and hold margins and is capable of carrying out a stable data identifying operation.

It is to be noted, however, that implementations of the present invention are by no means limited to the embodiments described above. That is to say, the present invention can be implemented into a variety of modified versions as long as the versions fall within the range of essentials of the present invention.

The present application contains subject matter related to that disclosed in Japanese Priority Patent Application JP 2009-101939 filed in the Japan Patent Office on Apr. 20, 2009, the entire content of which is hereby incorporated by reference.

What is claimed is:

1. A clock data recovery circuit comprising:
   a first phase detector configured to detect a difference in phase between input data and a clock signal extracted from said input data and generate signals each representing an analog quantity corresponding to said difference in phase;
   a loop filter configured to indirectly integrate and smooth said signals output by said first phase detector;
   a charge pump configured to supply an electrical charging current to said loop filter in accordance with a specific one of said signals output by said first phase detector or draw an electrical discharging current from said loop filter in accordance with another one of said signals output by said first phase detector;
   a voltage-controlled oscillator configured to generate said extracted clock signal vibrating at a frequency determined by a voltage output by said loop filter;
   a second phase detector configured to detect the polarity of said difference in phase between said input data and said extracted clock signal;
   a phase correction information generation section configured to generate phase correction information to be used for eliminating a phase offset of said first phase detector in accordance with detection results produced by said second phase detector; and
   a phase correction information addition section configured to add said phase correction information generated by said phase correction information generation section to a feedback loop including said first phase detector, said loop filter, said charge pump and said voltage-controlled oscillator,
   wherein said phase correction information addition section increases or decreases said electrical charging current supplied from said charge pump to said loop filter and decreases or increases said electrical discharging current drawn from said loop filter to said charge pump.

2. The clock data recovery circuit according to claim 1 wherein
   said first phase detector includes
   a first latch configured to latch said input data synchronously with an eye-center clock signal, a second latch configured to latch data existing in said first latch synchronously with an eye-edge clock signal having a phase opposite to the phase of said eye-center clock signal, a first detection circuit configured to detect a state of logic mismatching between said input data and data latched in said first latch and to generate a first up signal as a result of detecting said state of logic mismatching between said input data and data latched in said first latch, and a second detection circuit configured to detect a state of logic mismatching between data latched in said first latch and data latched in said second latch and to generate a first down signal as a result of detecting said state of logic mismatching between data latched in said first latch and data latched in said second latch, and said charge pump includes a first charge pump configured to supply an electrical charging current to said loop filter in accordance with said first up signal received from said first detection circuit, and a second charge pump configured to draw an electrical discharging current from said loop filter in accordance with said first down signal received from said second detection circuit.

3. The clock data recovery circuit according to claim 2 wherein said second phase detector includes a third latch configured to latch said input data synchronously with said eye-center clock signal, a fourth latch configured to latch data existing in said third latch synchronously with said eye-edge clock signal, a fifth latch configured to latch data existing in said fourth latch synchronously with said eye-center clock signal, a sixth latch configured to latch data existing in said third latch synchronously with said eye-center clock signal, a third detection circuit configured to detect a state of logic mismatching between data latched in said third latch and data latched in said fifth latch and to generate a second down signal as a result of detecting said state of logic mismatching between data latched in said third latch and data latched in said fifth latch, and a fourth detection circuit configured to detect a state of logic mismatching between data latched in said fifth latch and data latched in said sixth latch and to generate a second up signal as a result of detecting said state of logic mismatching between data latched in said fifth latch and data latched in said sixth latch, said phase correction information generation section includes a capacitor, a third charge pump configured to supply an electrical charging current to said capacitor in accordance with said second up signal received from said fourth detection circuit, and a fourth charge pump configured to draw an electrical discharging current from said capacitor in accordance with said second down signal received from said third detection circuit, and said phase correction information addition section includes a current feedback section configured to feed back a feedback signal to at least one of said first charge pump and said second charge pump so as to change at least one of said electrical charging current supplied by said first charge pump to said loop filter and said electrical discharging current drawn by said second charge pump from said loop filter by a predetermined current change proportional to a phase adjustment signal voltage appearing on said capacitor.

4. The clock data recovery circuit according to claim 3 wherein said third charge pump and said fourth charge pump operate only during time periods which are each defined by a mask signal.

5. The clock data recovery circuit according to claim 2 wherein said second phase detector includes a fourth latch configured to latch said input data synchronously with said eye-edge clock signal, a fifth latch configured to latch data existing in said fourth latch synchronously with said eye-center clock signal, a sixth latch configured to latch data existing in said first latch synchronously with said eye-center clock signal, a third detection circuit configured to detect a state of logic mismatching between data latched in said first latch and data latched in said fifth latch and to generate a second down signal as a result of detecting said state of logic mismatching between data latched in said first latch and data latched in said fifth latch, and a fourth detection circuit configured to detect a state of logic mismatching between data latched in said fifth latch and data latched in said sixth latch and to generate a second up signal as a result of detecting said state of logic mismatching data latched in said fifth latch and data latched in said sixth latch, said phase correction information generation section includes a capacitor, a third charge pump configured to supply an electrical charging current to said capacitor in accordance with said second up signal received from said fourth detection circuit, and a fourth charge pump configured to draw an electrical discharging current from said capacitor in accordance with said second down signal received from said third detection circuit, and said phase correction information addition section includes a current feedback section configured to feed back a feedback signal to at least one of said first charge pump and said second charge pump so as to change at least one of said electrical charging current supplied by said first charge pump to said loop filter and said electrical discharging current drawn by said second charge pump from said loop filter by a predetermined current change proportional to a phase adjustment signal voltage appearing on said capacitor.

6. The clock data recovery circuit according to claim 2 wherein said voltage-controlled oscillator generates a plurality of clock signals having the same plurality of phases shifted from each other, said second phase detector is designed as a multi-phase detection circuit making use of rising edges of four successive ones of said clock signals from said voltage-controlled oscillator as clock-signal edges configured to latch said input data having a pattern of successive eyes with timings corresponding to positions in close proximity to the center of any specific one of said eyes, a rear edge of said specific eye, the center of a following eye immediately lagging behind said specific eye and a rear edge of said following eye respectively, and said input data latched with a timing corresponding to a position in close proximity to the center of a predetermined one of said eyes as retimed data, said multi-phase detection circuit compares said retimed data with said input data latched with a timing corresponding to a position in close proximity to an eye edge flanked by said predetermined eye and an eye immediately preceding said predetermined eye in order to generate said second down signal on the basis of the result of the comparison and compares said retimed data with said input data latched with a timing corresponding to a position in close proximity to an eye edge flanked by said predetermined eye and an eye immediately succeeding said predetermined eye in order to generate said second up signal on the basis of the result of the comparison, said phase correction information generation section includes a loop filter, a third charge pump configured to supply an electrical charging current to said loop filter in accordance with said second up signal received from said multi-phase detection circuit, and a fourth charge pump configured to draw an electrical discharging current from said loop filter in accordance with said second down signal received from said multi-phase detection circuit, and said phase correction information addition section includes a current feedback section configured to feed back a feedback signal to at least one of said first charge pump and said second charge pump so as to change at least one of said electrical charging current supplied by said first charge pump to said loop filter and said electrical discharging current drawn by said second charge pump from said loop filter by a predetermined current change proportional to a phase adjustment signal voltage output by said capacitor.

7. A multiplied-frequency clock generation circuit comprising:

a first phase detector configured to detect a difference in phase between input clock and a multiplied-frequency clock signal and generate signals each representing an analog quantity corresponding to said difference in phase;

a loop filter configured to indirectly integrate and smooth said signals output by said first phase detector;

a charge pump configured to supply an electrical charging current to said loop filter in accordance with a specific one of said signals output by said first phase detector or draw an electrical discharging current from said loop filter in accordance with another one of said signals output by said first phase detector;

a voltage-controlled oscillator configured to generate said multiplied-frequency clock signal vibrating at a frequency determined by a voltage output by said loop filter;

a frequency divider configured to divide said frequency of said multiplied-frequency clock signal generated by said voltage-controlled oscillator in order to result in a divided frequency and output a divided-frequency clock signal having said divided frequency to said first phase detector;

a second phase detector configured to detect the polarity of said difference in phase between said input clock and said multiplied-frequency clock signal;

a phase correction information generation section configured to generate phase correction information to be used for eliminating a phase offset of said first phase detector and said frequency divider in accordance with a detection result produced by said second phase detector; and a phase correction information addition section configured to add said phase correction information generated by said phase correction information generation section to a feedback loop including said first phase detector, said loop filter, said charge pump, and said voltage-controlled oscillator, wherein said phase correction information addition section increases or decreases said electrical charging current supplied from said charge pump to said loop filter and decreases or increases said electrical discharging current drawn from said loop filter to said charge pump.

8. The multiplied-frequency clock generation circuit according to claim 7 wherein said first phase detector includes a first latch configured to generate an up signal synchronously with said input clock, and a second latch configured to generate a down signal synchronously with said divided-frequency clock signal generated by said frequency divider, said first phase detector resets said first and second latches if the level of said up signal matches the level of said down signal, and said charge pump includes a first charge pump configured to supply an electrical charging current to said loop filter in accordance with said up signal received from said first latch, and a second charge pump configured to draw an electrical discharging current from said loop filter in accordance with said down signal received from said second latch.

9. The multiplied-frequency clock generation circuit according to claim 8 wherein said second phase detector has a third latch configured to latch said multiplied-frequency clock signal from said voltage-controlled oscillator synchronously with said input data, said phase correction information generation section includes a capacitor, and a third charge pump configured to supply an electrical charging current to said capacitor or draw an electrical discharging current from said capacitor in accordance with data latched in said third latch, and said phase correction information addition section includes a current feedback section configured to feed back a feedback signal to at least one of said first charge pump and said second charge pump so as to change at least one of said electrical charging current supplied by said first charge pump to said loop filter and said electrical discharging current drawn by said second charge pump from said loop filter by a predetermined current change proportional to a phase adjustment signal voltage appearing on said capacitor.

* * * * *